United States Patent
Bruce et al.

[19]

[11] Patent Number: 5,972,570
[45] Date of Patent: Oct. 26, 1999

[54] METHOD OF PHOTOLITHOGRAPHICALLY DEFINING THREE REGIONS WITH ONE MASK STEP AND SELF ALIGNED ISOLATION STRUCTURE FORMED THEREBY

[75] Inventors: James A. Bruce, Williston; Steven J. Holmes, Milton; Robert K. Leidy, Burlington; Walter E. Mlynko, Essex Junction; Edward W. Sengle, Hinesburg, all of Vt.

[73] Assignee: International Business Machines Corporation, Armonk, N.Y.

[21] Appl. No.: 08/895,748

[22] Filed: Jul. 17, 1997

[51] Int. Cl.⁶ .................................. G03F 7/26; G03F 7/20
[52] U.S. Cl. .......................... 430/314; 430/313; 430/317
[58] Field of Search .................................. 430/312, 313, 430/314, 316, 317, 394, 323

[56] References Cited

U.S. PATENT DOCUMENTS

| | | | |
|---|---|---|---|
| 4,377,633 | 3/1983 | Abrahamovich et al. | 430/312 |
| 4,405,708 | 9/1983 | Van Pelt et al. | 430/281 |
| 4,568,631 | 2/1986 | Badami et al. | 430/315 |
| 4,687,730 | 8/1987 | Eron | 430/324 |
| 4,707,218 | 11/1987 | Giammaroo et al. | 156/643 |
| 4,997,746 | 3/1991 | Greco et al. | 430/314 |
| 5,166,771 | 11/1992 | Godinho et al. | 257/368 |
| 5,173,439 | 12/1992 | Dash et al. | 437/67 |
| 5,244,759 | 9/1993 | Pierrat | 430/312 |
| 5,275,896 | 1/1994 | Garofalo et al. | 430/313 |
| 5,308,721 | 5/1994 | Garofalo et al. | 430/313 |
| 5,330,879 | 7/1994 | Dennison | 430/313 |
| 5,366,923 | 11/1994 | Boyer et al. | 437/62 |
| 5,385,861 | 1/1995 | Bashir et al. | 437/67 |
| 5,436,190 | 7/1995 | Yang et al. | 437/67 |
| 5,486,449 | 1/1996 | Hosono et al. | 430/313 |
| 5,492,858 | 2/1996 | Bose et al. | 437/67 |
| 5,516,625 | 5/1996 | McNamara et al. | 430/314 |
| 5,516,721 | 5/1996 | Galli et al. | 437/67 |
| 5,741,624 | 4/1998 | Jeng et al. | 430/312 |
| 5,776,660 | 7/1998 | Hakey et al. | 430/286 |

OTHER PUBLICATIONS

Moreau, Wayne M.; Semiconductor Lithography Principals, Practices and Materials.; 1988; pp. 47–48,76–77,195–197, 733–734,771; and p. 776.

*Primary Examiner*—Kathleen Duda
*Assistant Examiner*—Jill N. Holloman
*Attorney, Agent, or Firm*—Schmeiser, Olsen & Watts; Mark F. Chardurjian

[57] ABSTRACT

The preferred embodiment of the present invention provides a method for defining three regions on a semiconductor substrate using a single masking step. The preferred embodiment uses a photoresist material having, simultaneously, both a positive tone and a negative tone response to exposure. This combination of materials can provide a new type of resist, which we call a hybrid resist. The hybrid resist comprises a positive tone component which acts at a first actinic energy level and a negative tone component which acts at a second actinic energy level, with the first and second actinic energy levels being separated by an intermediate range of actinic energy. When hybrid resist is exposed to actinic energy, areas of the resist which are subject to a full exposure cross link to form a negative tone line pattern, areas which are unexposed form remain photoactive and form a positive tone pattern, and areas which are exposed to intermediate amounts of radiation become soluble and wash away during development. This exposes a first region on the mask. By then blanket exposing the hybrid resist, the positive tone patterns become soluble and will wash away during development. This exposes a second region on the mask, with the third region still be covered by the hybrid resist. Thus, the preferred embodiment is able to define three regions using a single masking step, with no chance for overlay errors.

19 Claims, 32 Drawing Sheets

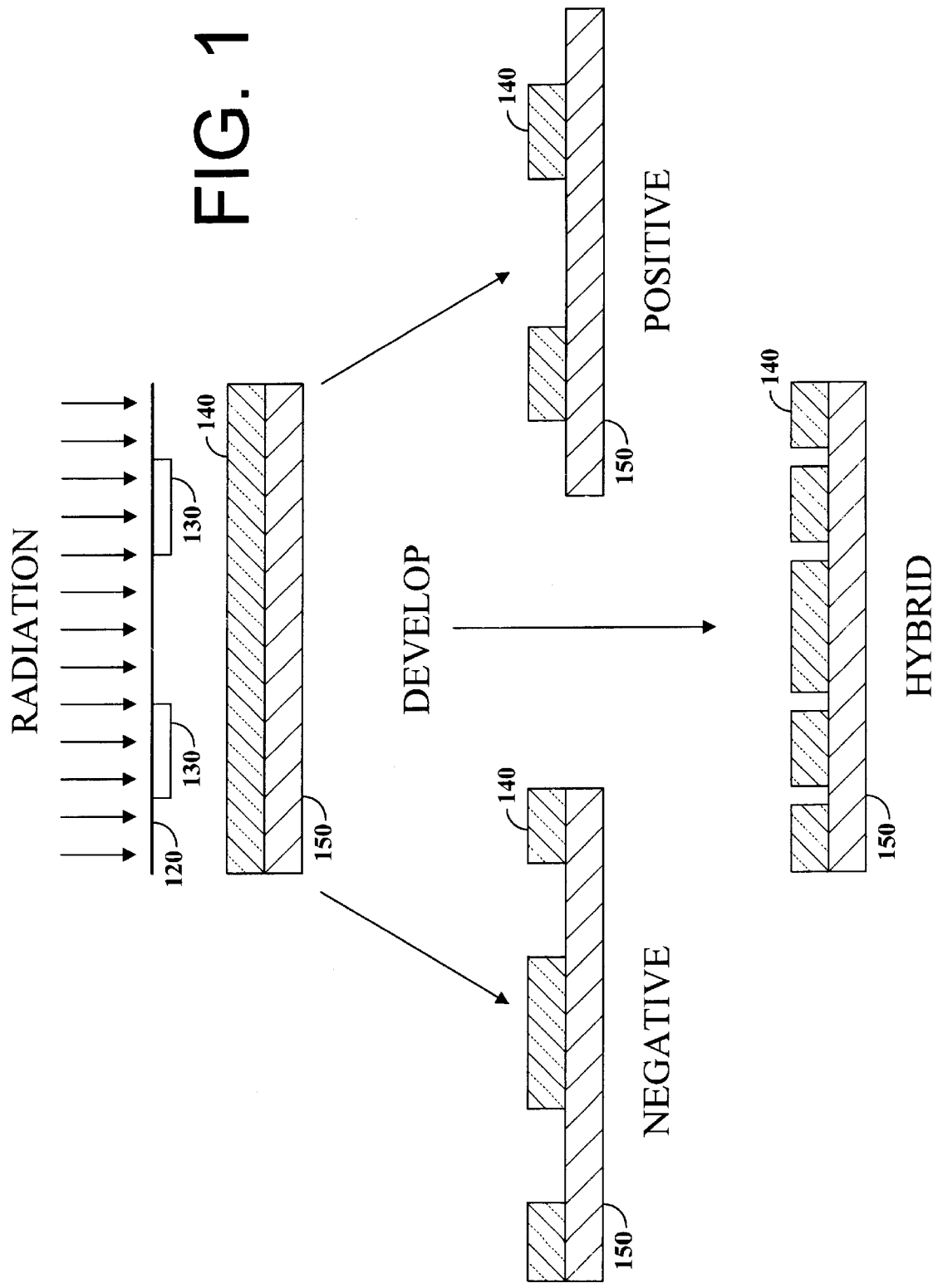

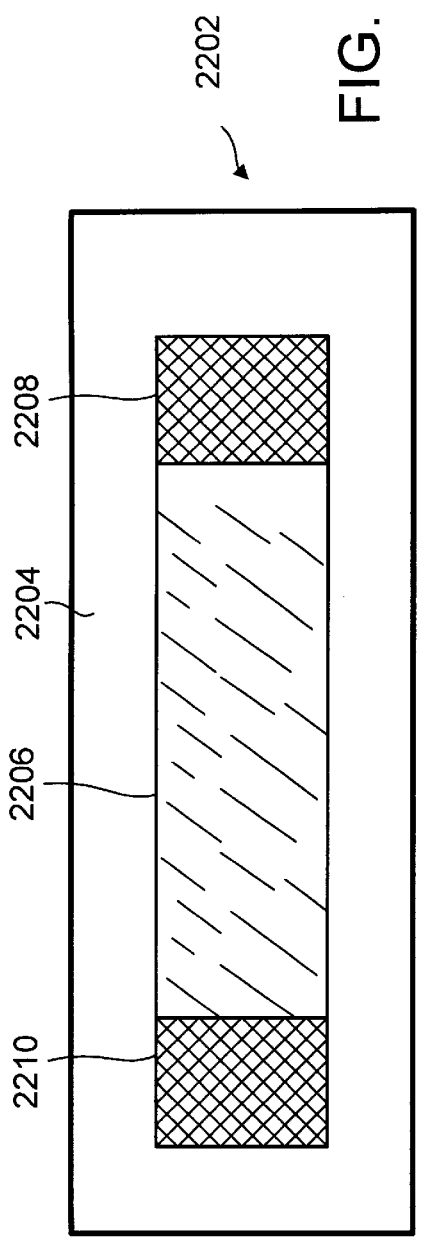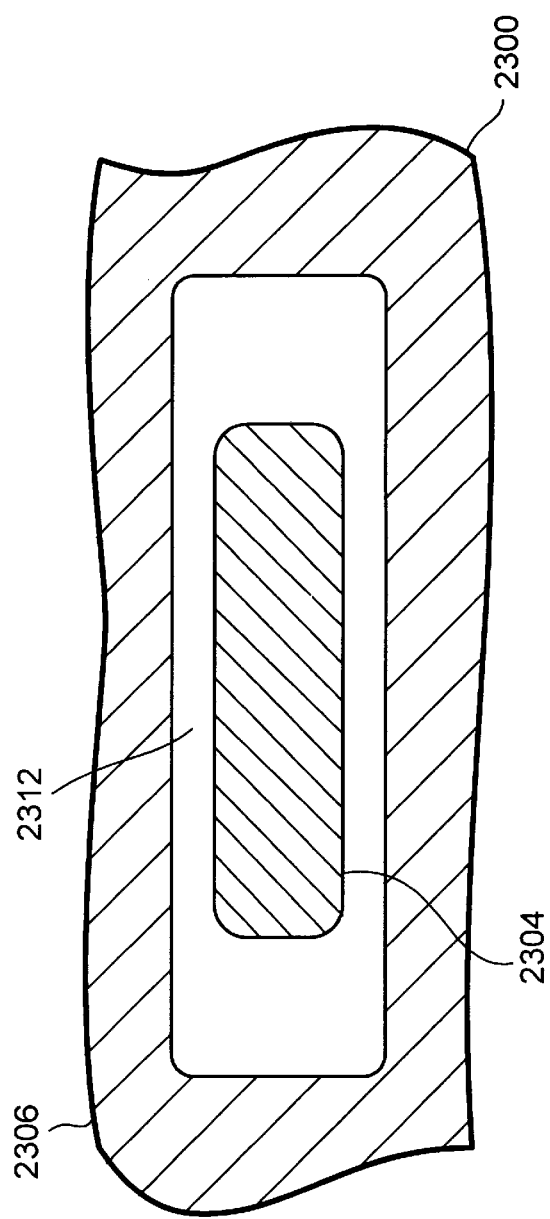

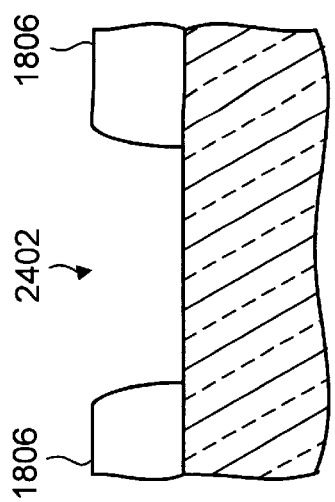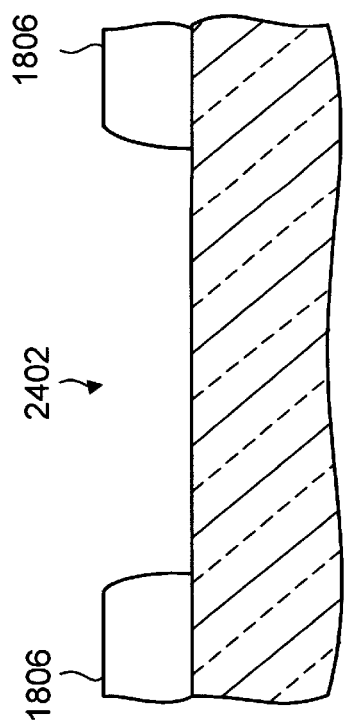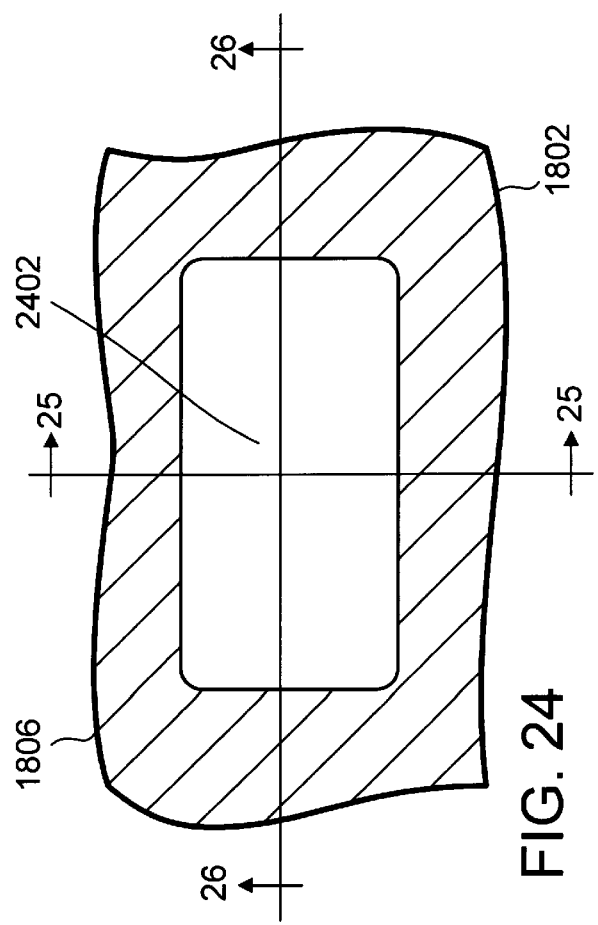

[5,972,570]

METHOD OF PHOTOLITHOGRAPHICALLY DEFINING THREE REGIONS WITH ONE MASK STEP AND SELF ALIGNED ISOLATION STRUCTURE FORMED THEREBY

RELATED APPLICATIONS

This application is related to the following U.S. Patent applications: "Method for Forming Sidewall Spacers using Frequency Doubling Hybrid Resist and Device Formed Thereby," Ser. No. 08/895,749, filed this same day; "Low 'K' Factor Hybrid Photoresist," Ser. No. 08/715,288, Docket No. FI9-96-055; and "Frequency Doubling Photoresist," Ser. No. 08/715,287, Docket No. BU9-96-047, both filed Sep. 16, 1996.

BACKGROUND OF THE INVENTION

1. Technical Field

The present invention relates generally to a process in the manufacturing of semiconductor devices. More, specifically, the present invention relates to a process for defining three regions on a semiconductor wafer with only one masking step.

2. Background Art

Photolithography has long been used to define and form semiconductor devices. Photolithography consists of depositing a photoactive resist on the semiconductor device and exposing the resist through a mask such that portions of the mask are exposed to radiation, and other portions are not exposed. If the resist was positive tone resist, then the portions of the resist which were exposed wash away during development. If the resist was a negative tone resist, then the portions of the resist which were not exposed during exposure wash away during development. Thus, conventional prior art is able to define two regions using a masking step, i.e., the all the areas where resist is removed during development, and all of the areas where resist remains after development.

If further definition of the device is needed, a second layer of resist and a second exposure and development will be required. The use of multiple exposure steps through multiple masks has several disadvantages. First, the inherent complexity of adding additional processing steps reduces the efficiency of the fabrication line. Secondly, it is almost impossible to line up the second mask exactly with the first. This variation in masking alignment is commonly referred to as overlay error.

Thus what is needed is an improved fabrication process that allows for the definition of multiple areas using single masking steps such that processing complexity and the propensity of overlay error is reduced.

DISCLOSURE OF INVENTION

The present invention provides a method for defining three regions on a semiconductor substrate using a single masking step. The preferred embodiment uses a photoresist material having, simultaneously, both a positive tone and a negative tone response to exposure. This combination of materials can provide a new type of resist, which we call a hybrid resist. The hybrid resist comprises a positive tone component which acts at a first actinic energy level and a negative tone component which acts at a second actinic energy level, with the first and second actinic energy levels being separated by an intermediate range of actinic energy. When hybrid resist is exposed to actinic energy, areas of the resist which are subject to a full exposure cross link to form a negative tone line pattern, areas which are unexposed form remain photoactive and form a positive tone pattern, and areas which are exposed to intermediate amounts of radiation become soluble and wash away during development. This exposes a first region on the mask. By then blanket exposing the hybrid resist, the positive tone patterns become soluble and will wash away during development. This exposes a second region on the mask, with the third region still be covered by the hybrid resist. Thus, the preferred embodiment is able to define three regions using a single masking step, with no chance for overlay errors.

The present invention can be used in a wide variety of applications to provide a wide variety of features. For example, the present invention can be used to define shallow trench isolation with relatively deep edge regions and shallow regions in between. This can be done with a single masking step.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

FIG. 22 is a schematic view of an exemplary mask portion;

FIG. 23 is a top schematic view of a wafer portion with patterned hybrid resist upon it;

FIG. 24 is a top schematic view of a wafer portion with the positive tone pattern of hybrid resist exposed and developed away;

FIG. 25 is a cross-sectional side view of the wafer portion of FIG. 24 taken along line 25—25;

FIG. 26 is a cross-sectional side view of the wafer portion of FIG. 24 taken along line 26—26;

BEST MODE FOR CARRYING OUT THE INVENTION

Figure 3:
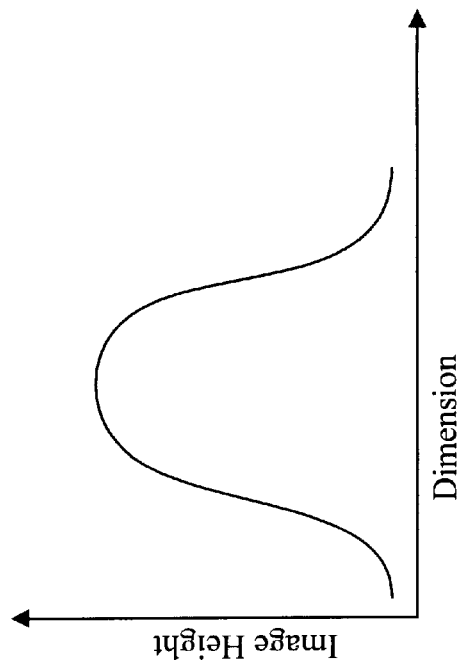
FIG. 3 is a graph illustrating the line pattern for positive resist printed with a reticle line pattern.

The preferred embodiment of the present invention overcomes the limitations of the prior art and provides a method to define three distinct regions on a wafer using one masking step. The preferred embodiment uses hybrid resist which exhibits both positive and negative tone responses as well as an intermediate response, thereby facilitating the definition of the three distinct regions. A description of hybrid resist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 μm and less can be printed with current deep ultra violet (DUV) lithography tools that are designed for operation at 0.35 μm resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 μm feature with conventional resist generally requires a 0.2 μm reticle image size. With hybrid resist, a 0.2 μm space can be formed with a single edge of a reticle feature; for example, a 0.5 μm reticle opening could produce two 0.2 μm spaces and a 0.2 μm line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
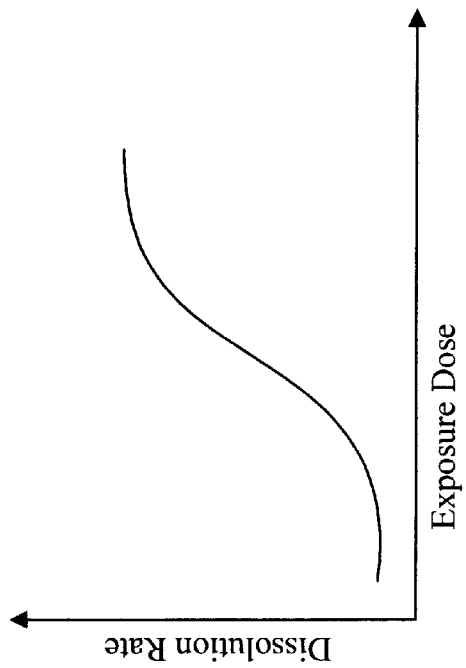
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
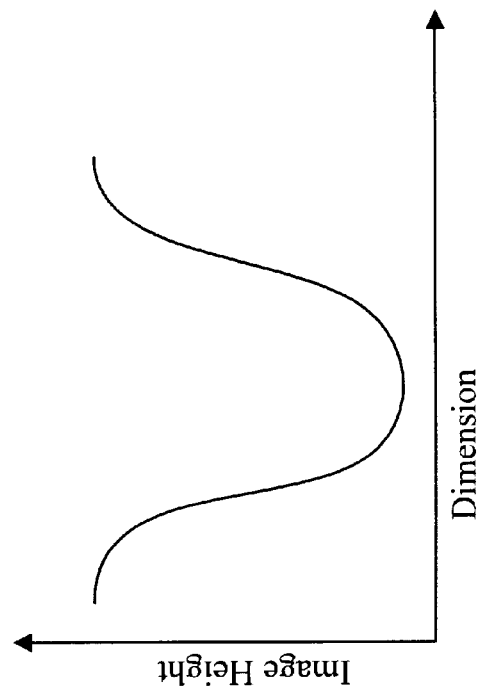
FIG. 5 is a graph illustrating the line pattern for negative resist printed with a reticle line pattern.
Figure 4:
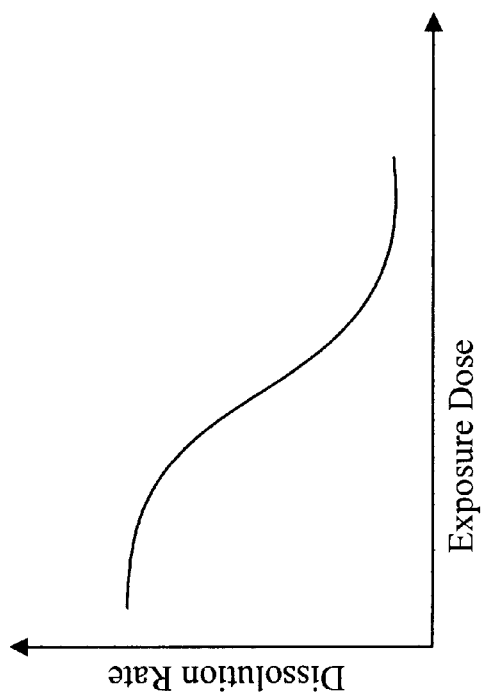
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
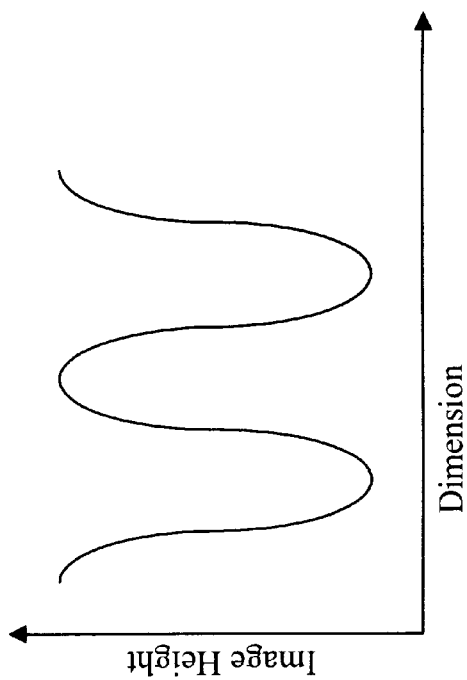
FIG. 7 is a graph illustrating the space/line/space pattern formed onto a substrate using hybrid resist.
Figure 6:
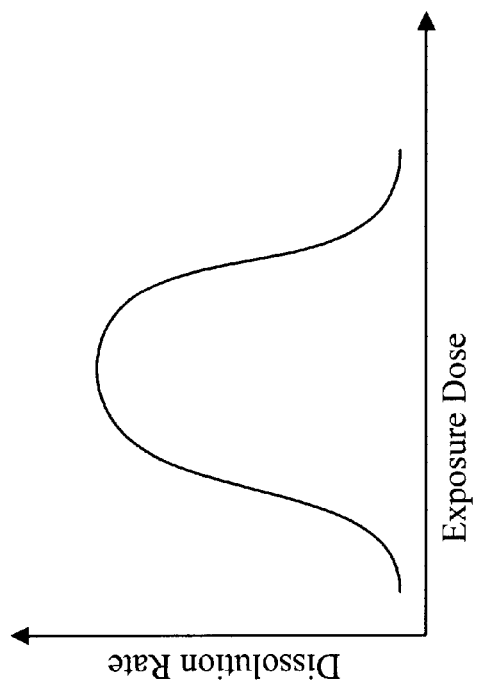
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
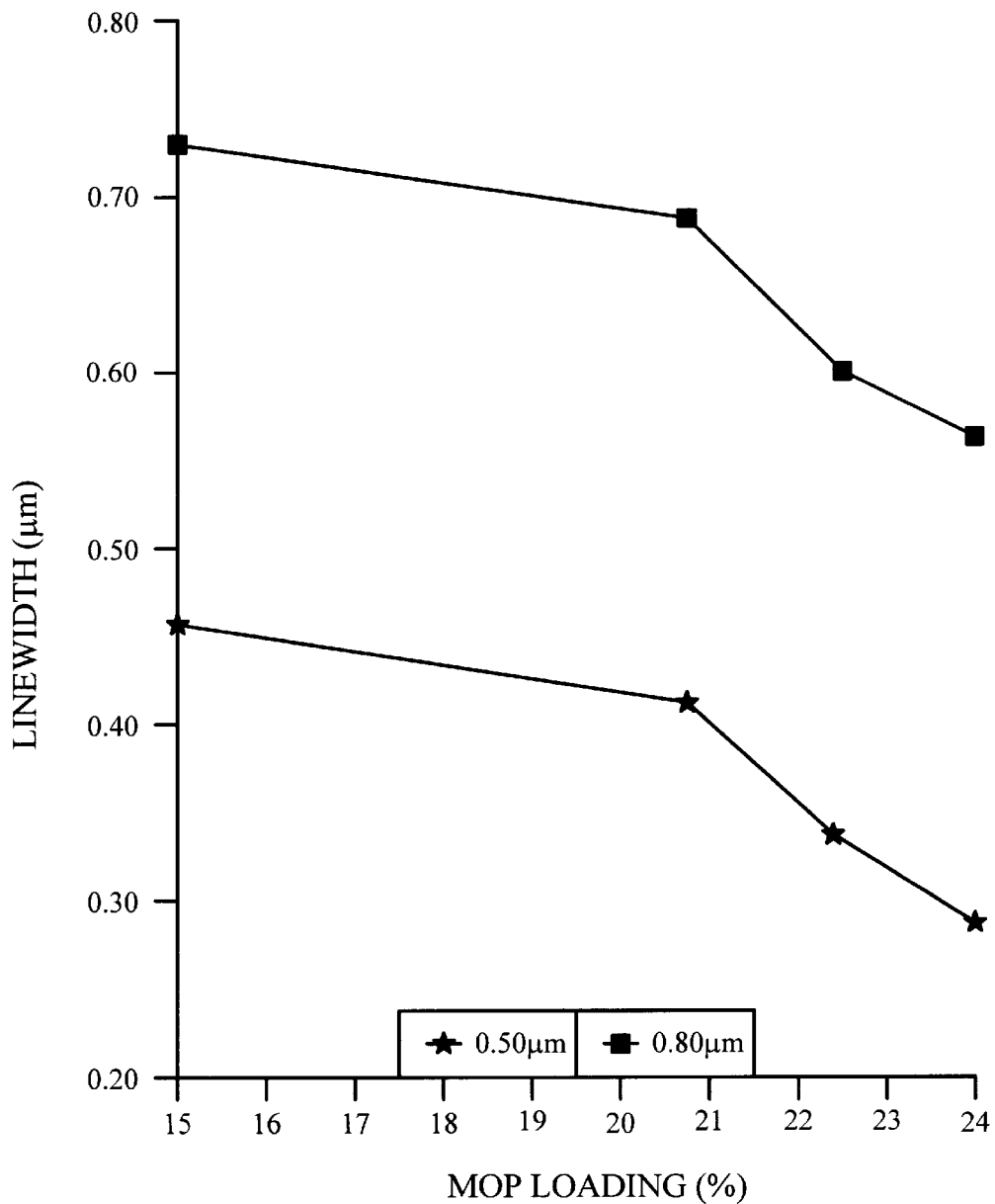
FIG. 10 is a graph showing the linewidth in nm plotted against the amount of positive tone solubility inhibitor (MOP) incorporated in a hybrid resist of the present invention.
Figure 15:
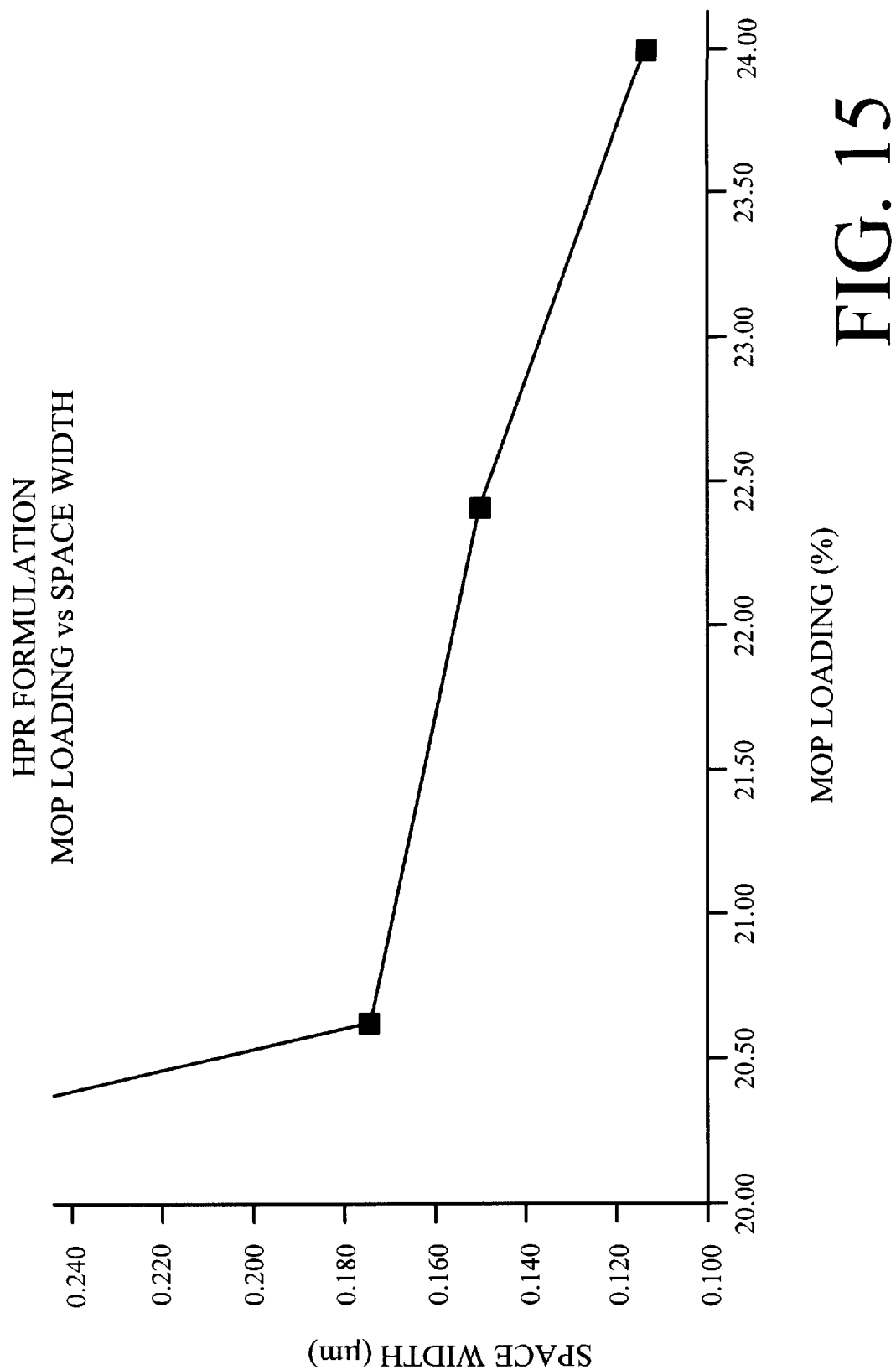
FIG. 15 is a graph showing the variation in space width in μm as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
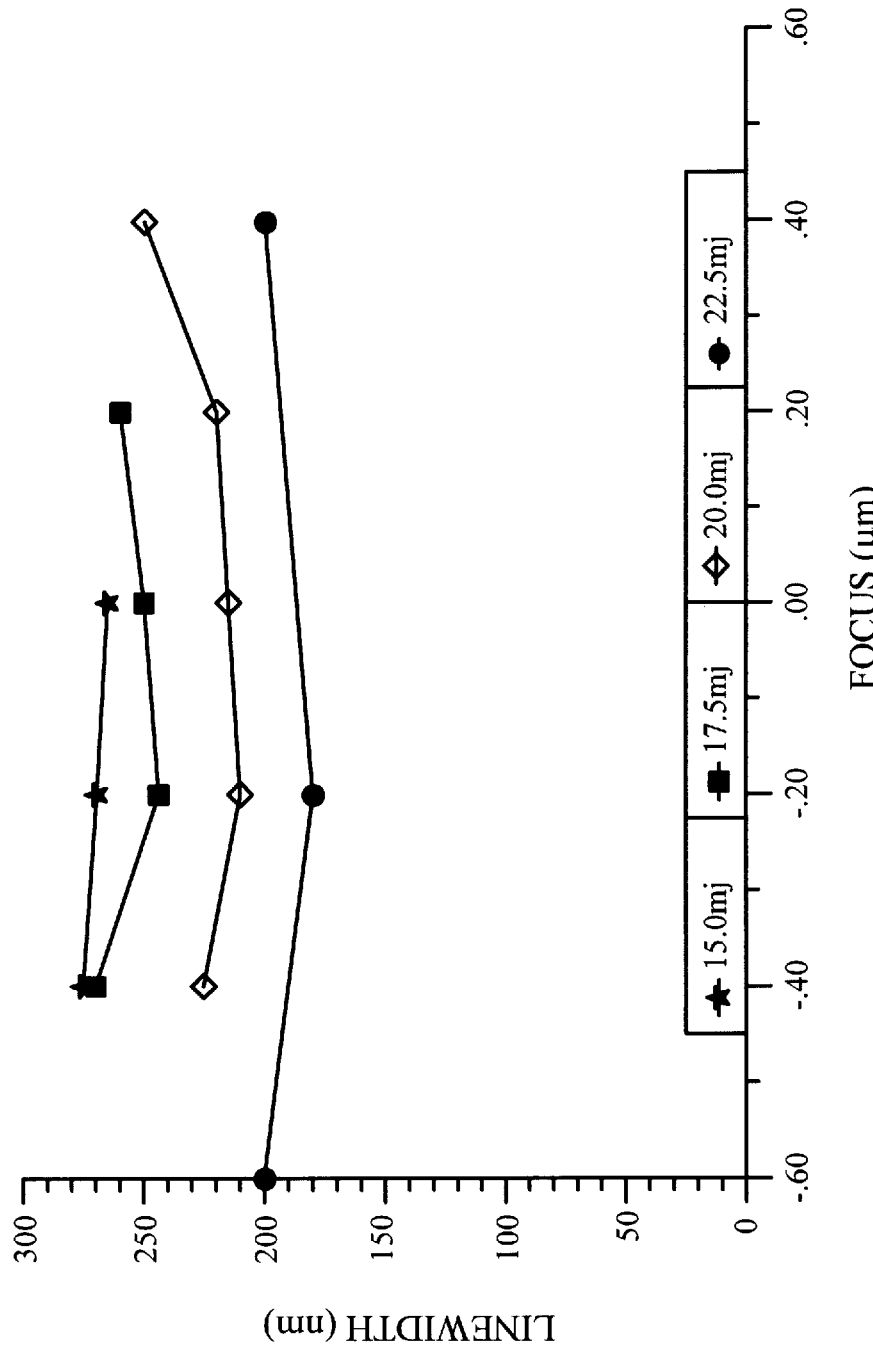
FIG. 8 is a graph of linewidth in nanometers (nm) plotted against focus in microns ($\mu$m) of a formulation of a standard negative resist at various exposure energies.
Figure 9:
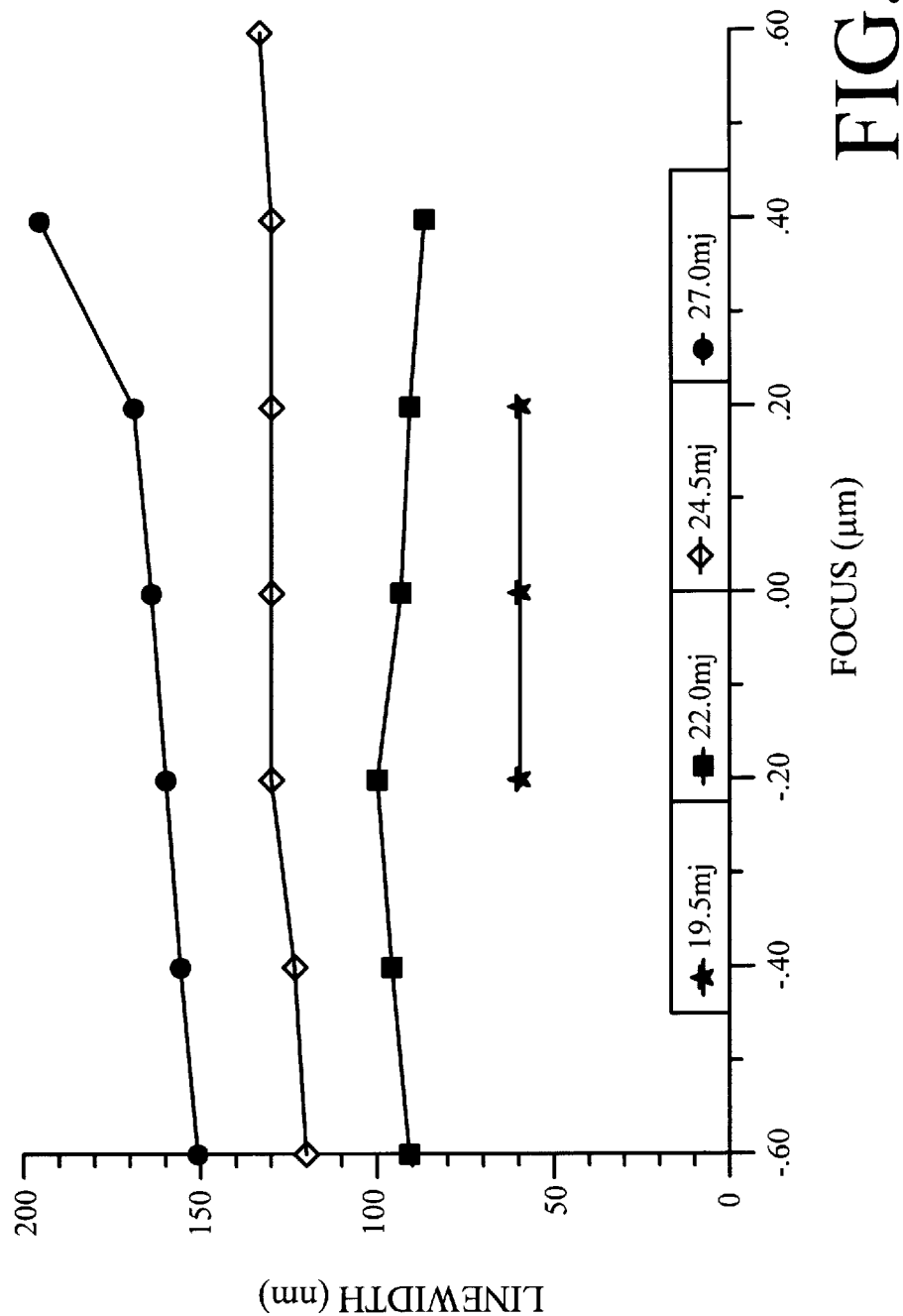
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
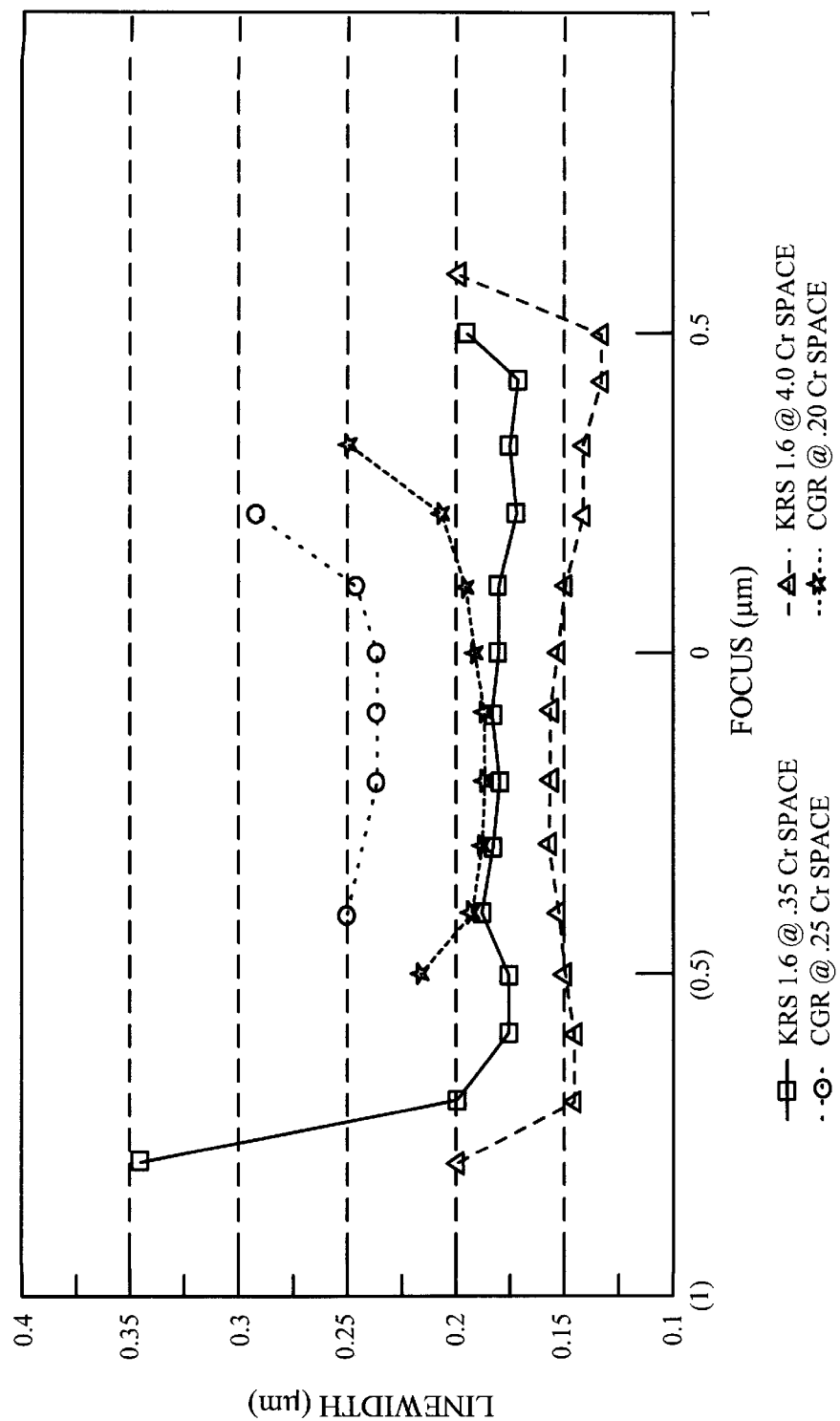
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene copolymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

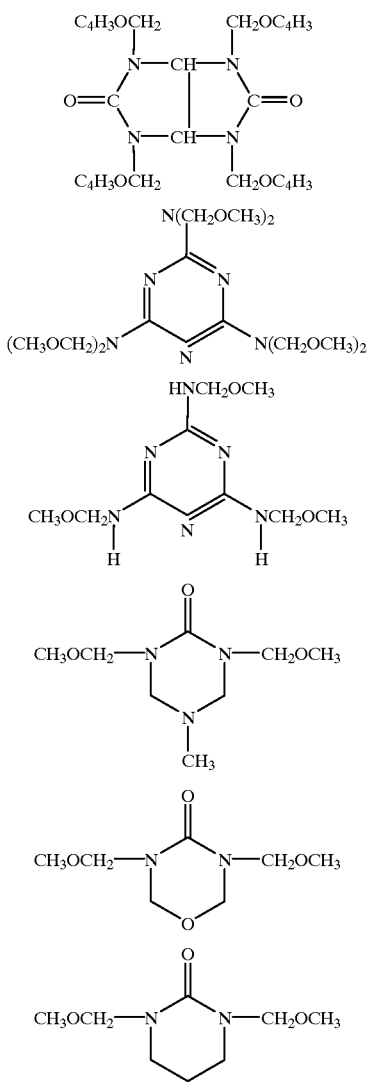

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

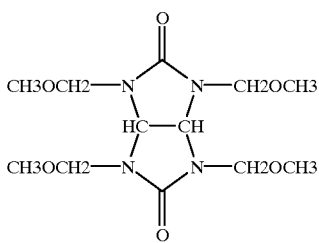

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propyleneglycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:
poly(hydroxystyrene) (PHS), 10% hydrogenated, available from Maruzen America, New York, N.Y. with about 25% of the phenol groups protected with methoxypropene (MOP), 81.2% of solids;
N-(trifluoromethylsulfonyloxy)-bicyclo-[2.2.1]-hept-5-ene-2,3-dicarboximide (MDT), available from Daychem Labs, Centerville, Ohio, 10.5% of solids;
tetramethoxymethyl glycouril (Powderlink), available from Cytec, Danbury, Conn., 8.2% of solids; and
7-diethylamino-4-methyl coumarin dye (Coumarin 1), available from the Aldrich Chemical Company, 0.1% of solids.

The solution was filtered through a 0.2 μm filter. The solution was coated onto silicon wafers primed with hexamethyl- disilazane with a soft bake of 110° Celsius (C) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative cross-linking chemistry becomes predominant and the dissolution rate falls back to a value close to zero.

Figure 13:
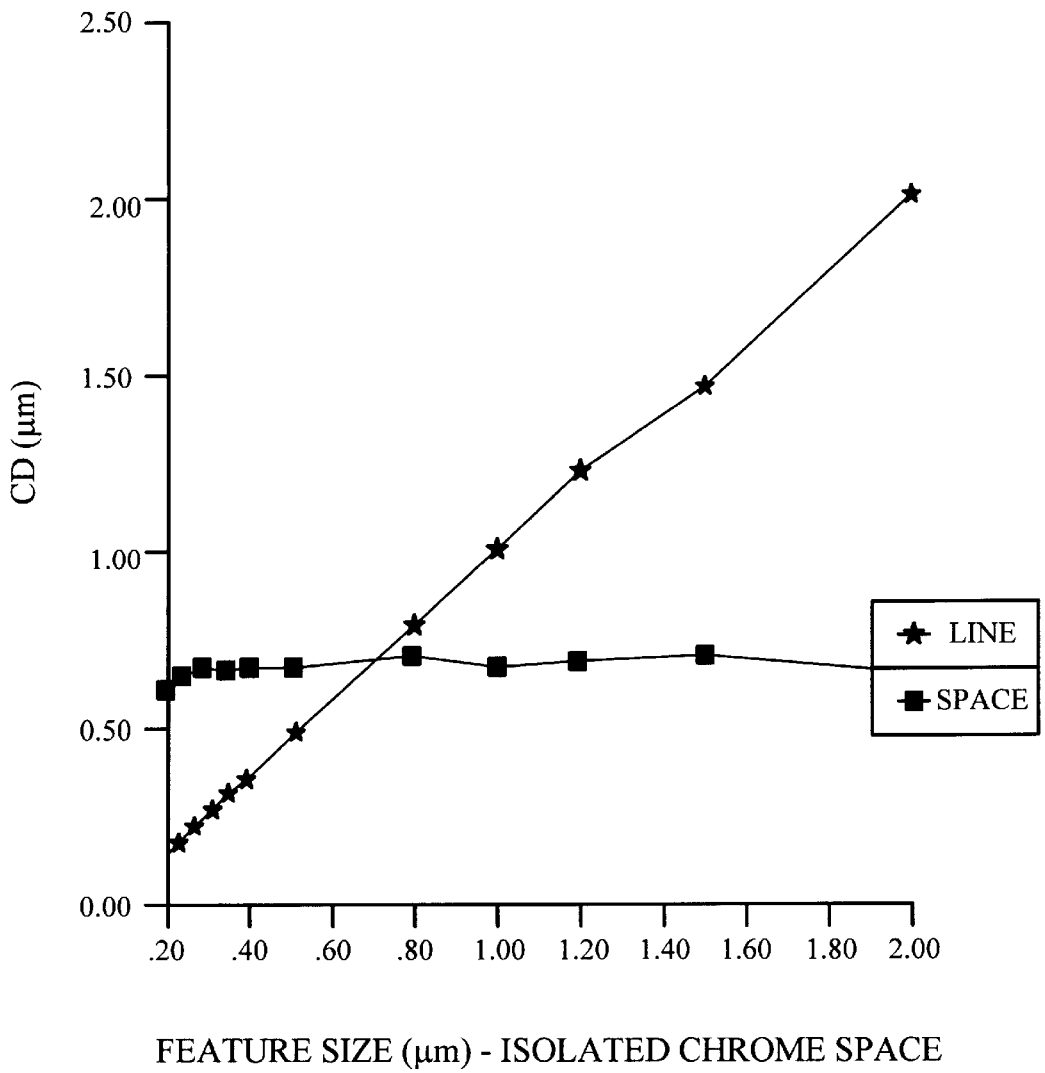
FIG. 13 is a graph showing the resultant line and space widths as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/ line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:
PHS with about 25% of the phenol groups protected with MOP, 90.8% of solids;
triphenyl sulfonium triflate, 1.3% of solids;
Powderlink, 7.8% of solids;
tetrabutyl ammonium hydroxide base, 0.1% of solids; and
sufficient PM acetate containing 350 ppm FC-430 surfactant as a solvent to form a 18.9% solids solution.

Figure 12:
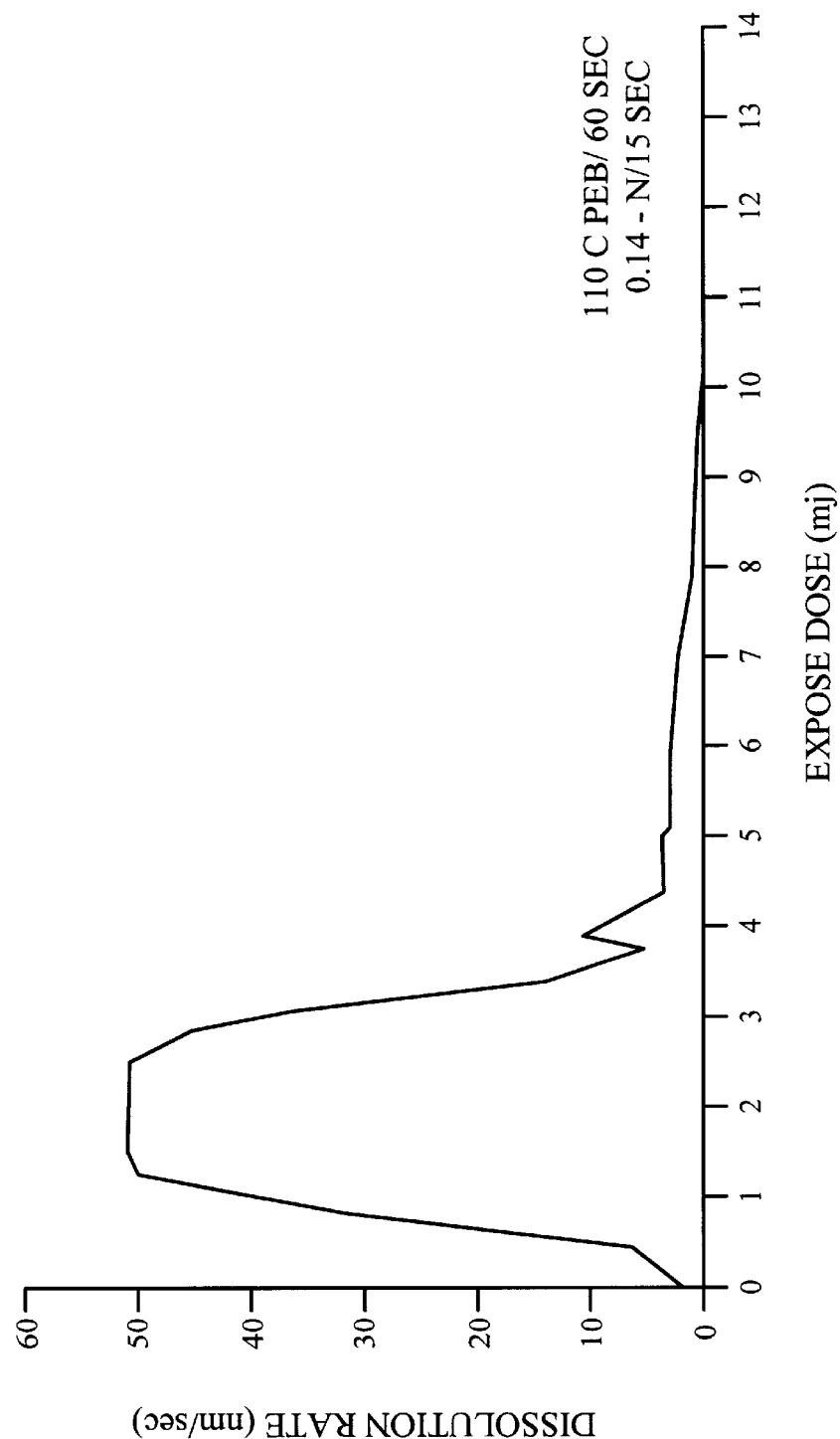
FIG. 12 is a graph showing the dissolution rate in nanometers per second (nm/sec) as a function of the exposure dose in milliJoules (mJ) using one formulation of a hybrid resist of the present invention.
Figure 14:
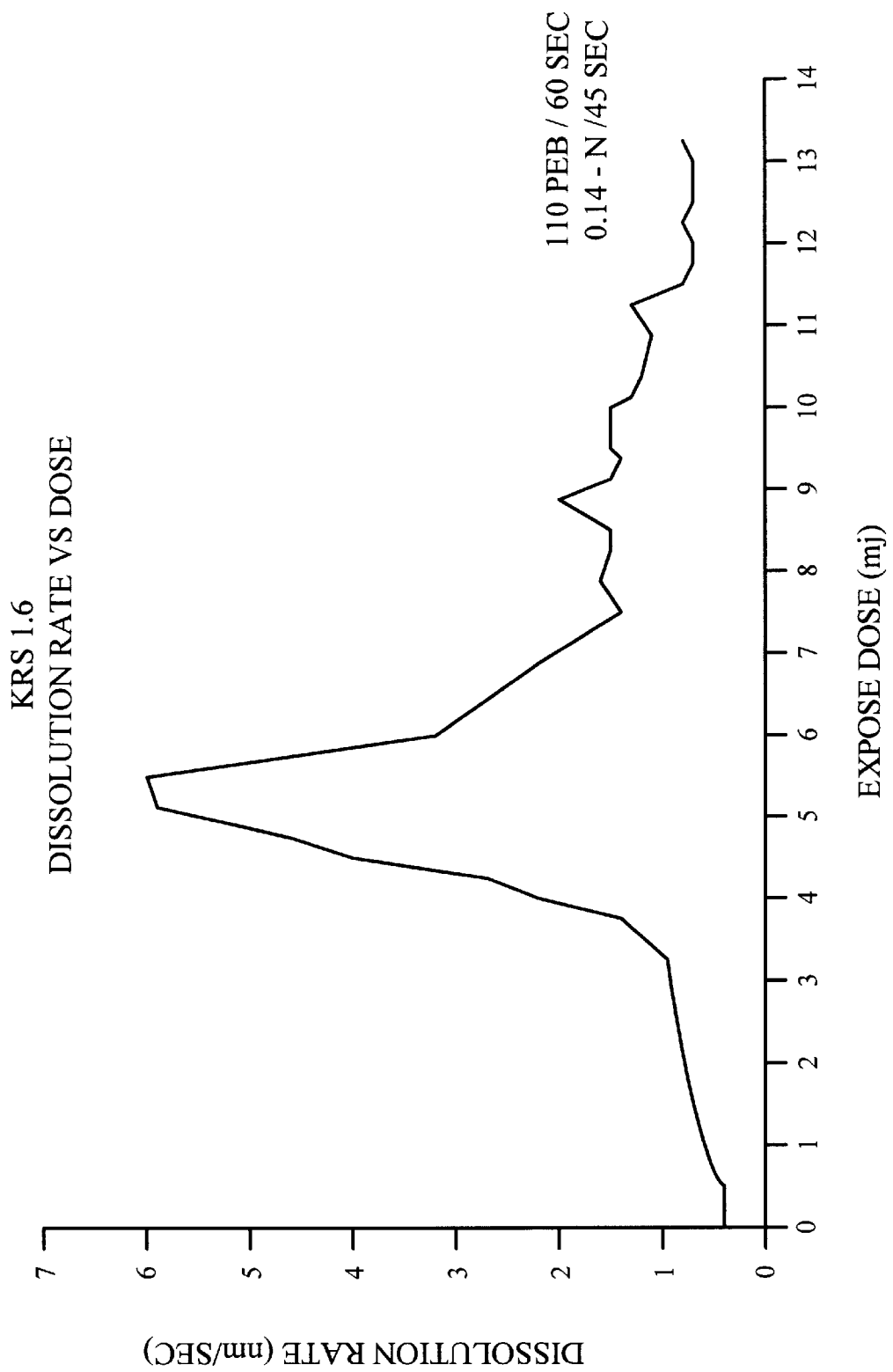
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
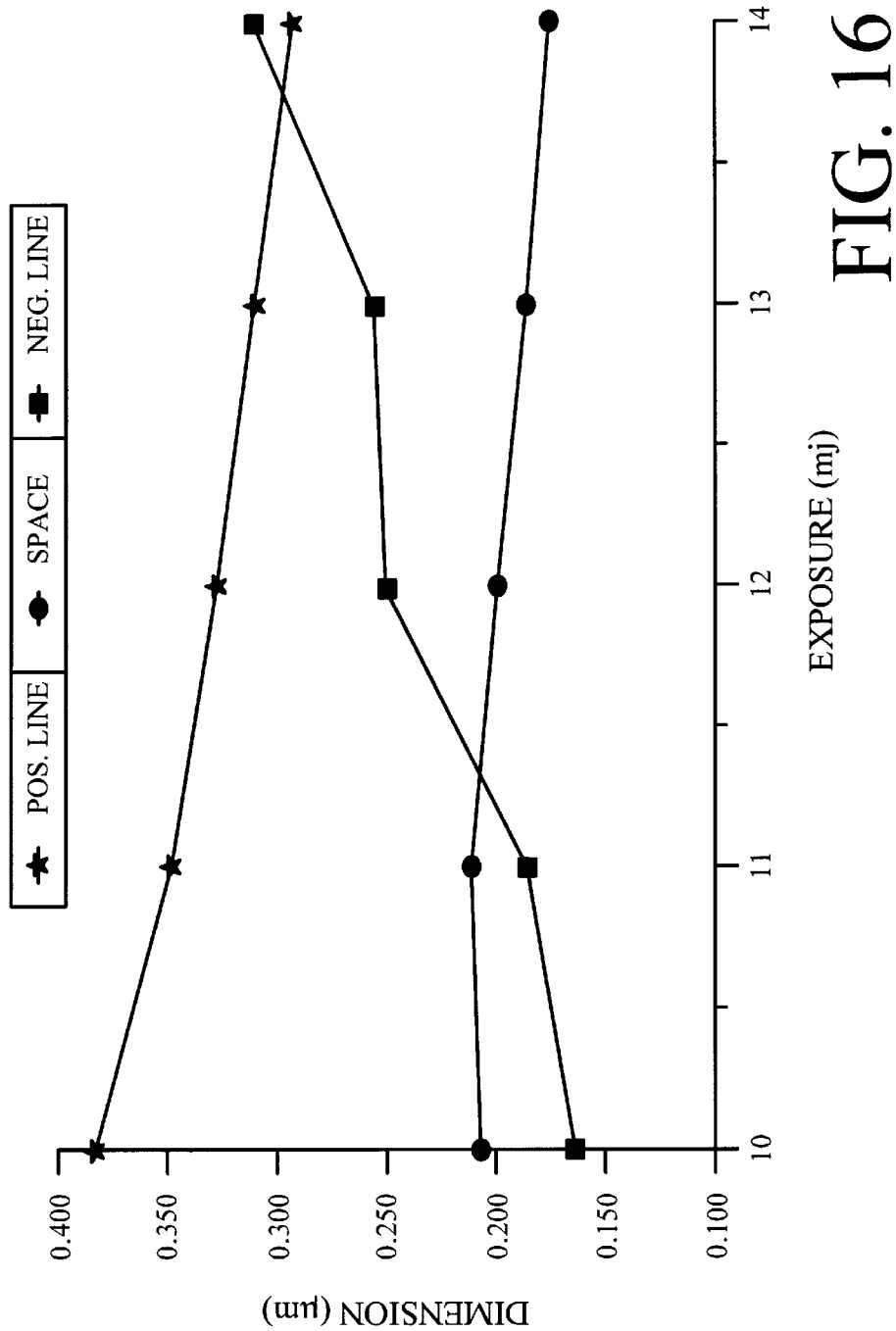
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of exposure dose. The space remains relatively constant in the range of about 0.18 μm, whereas both lines vary as the exposure dose is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 μm. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter (cm$^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 μm was observed for the hybrid resist relative to the standard negative resist, as calculated using standard methods known in the art.

Preferred Embodiments

The preferred embodiments capitalize on the unique properties of hybrid resist to define three regions on a substrate with one masking step. The hybrid resist comprises a positive tone component which acts at a first actinic energy level and a negative tone component which acts at a second actinic energy level, with the first and second actinic energy levels being separated by an intermediate range of actinic energy.

When hybrid resist is exposed to actinic energy, areas of the resist which are subject to a full exposure cross link to form a negative tone line pattern, areas which are unexposed form remain photoactive and form a positive tone pattern, and areas which are exposed to intermediate amounts of radiation become soluble and wash away during development.

Figure 21:
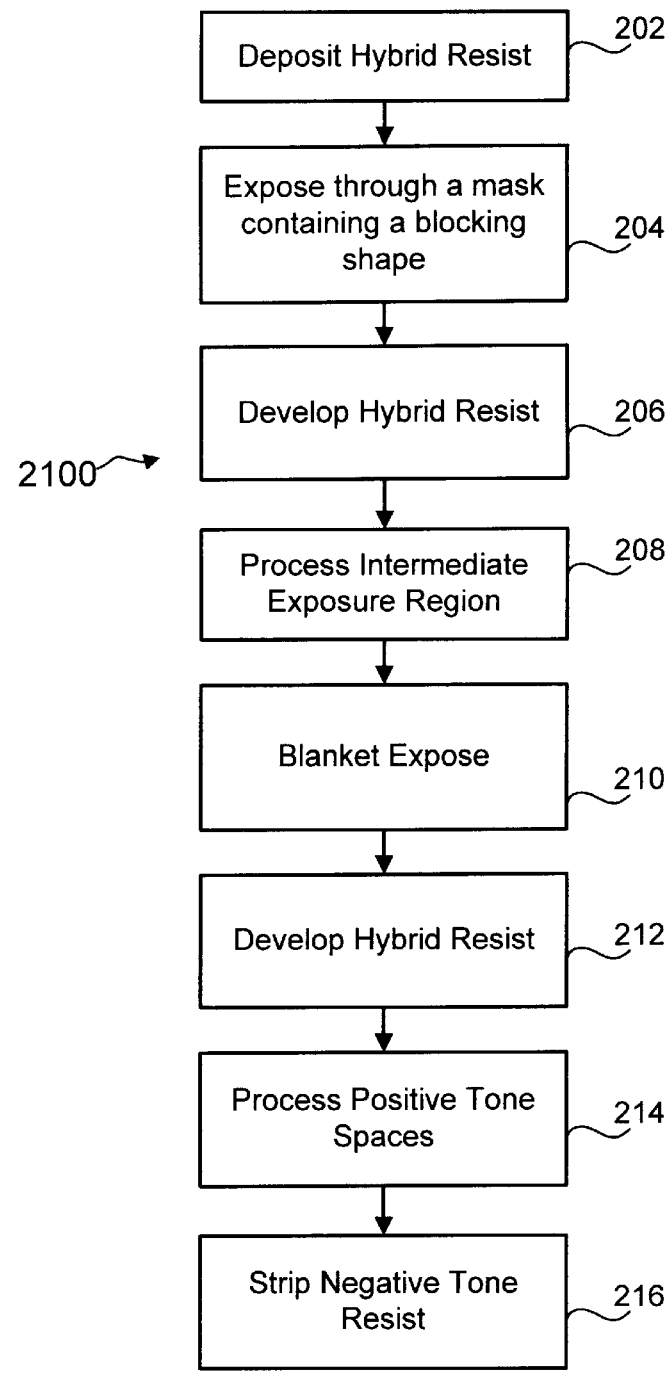
FIG. 21 is a flow diagram illustrating a first embodiment method.

Turning to FIG. 21, a method 2100 in accordance with the preferred embodiment for defining three regions on a substrate is illustrated. The first step 202 is to deposit hybrid resist. The second step 204 is to expose the hybrid resist through a mask containing at least one blocking shape (i.e., a shape that does not allow actinic radiation to pass through). Following a post exposure bake, the next step 206 is to develop the hybrid resist. In accordance with the properties of hybrid resist, areas of the hybrid resist which were exposed to intermediate amounts of exposure become soluble and wash away during development.

Figure 17:
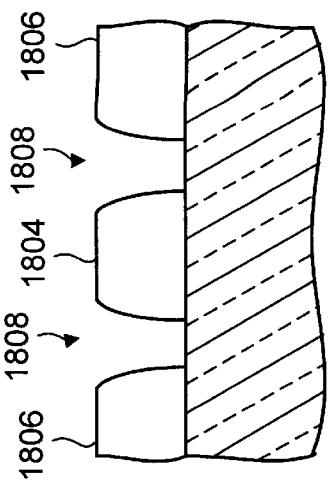
FIG. 17 is a schematic view of an exemplary mask portion.
Figure 19:
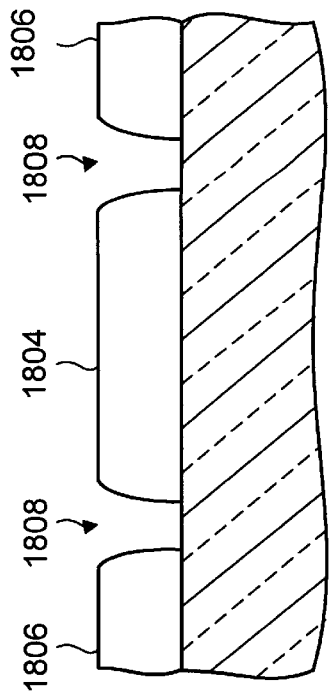
FIG. 19 is a cross-sectional side view of the wafer portion of FIG. 18 taken along line 19—19.
Figure 20:
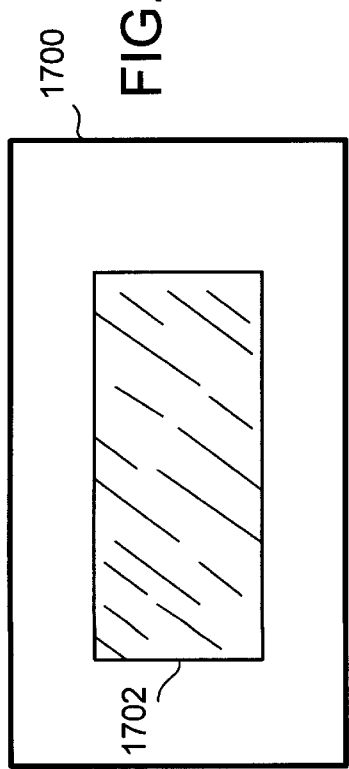
FIG. 20 is a cross-sectional side view of the wafer portion of FIG. 18 taken along line 20—20.

Turning to FIG. 17, an exemplary mask 1700 containing a blocking shape 1702 is illustrated. The blocking shape 1702 blocks the actinic energy from reaching the underlying photoresist. When hybrid resist is deposited on a wafer, exposed with actinic radiation through mask 1700, and developed, the mask 1700 creates the a "linked" or "donut" pattern in the hybrid resist. Such a linked pattern is illustrated in FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
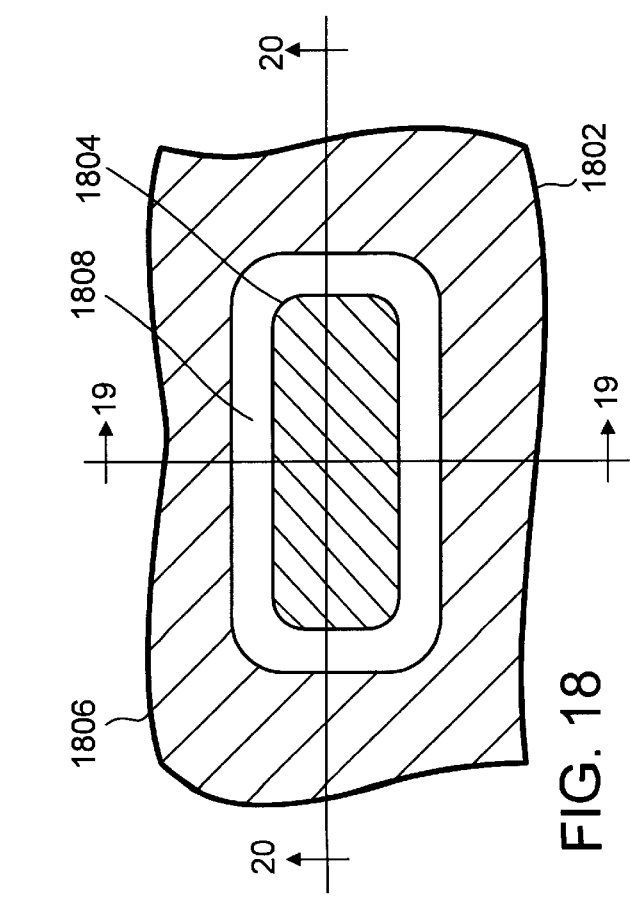
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702) are completely cross-linked and form a negative tone line pattern. Hybrid resist portions which are exposed with intermediate amounts of intensity (i.e., the areas under the edges of mask shape 1702) become soluble in developer solution after the first exposure and are dissolved during the development step and form space 1808 in the hybrid resist.

The spaces in the hybrid resist created by an intermediate exposure and development (e.g., spaces 1808) define the first of three regions defined with one masking step according to the preferred embodiment.

In addition to using the edge of blocking mask shapes to define intermediate exposure regions, grey scale mask shapes can be used to define these intermediate exposure regions. These grey scale shapes can be used alone, on in conjunction with the blocking shapes on the same mask.

Turning to FIG. 22, a exemplary mask portion 2202 with grey scale portions is illustrated. The mask portion 2202 includes a transparent shape 2204 around the exterior of mask portion 2202. The mask portion 2202 also includes a blocking shape 2206 (i.e., a portion that is not transparent to the used actinic radiation.) Additionally the mask portion 2202 includes two grey-scale shapes 2208 and 2210. The grey scale shapes 2208 and 2210 allow areas of the hybrid resist under them to be exposed to intermediate amounts of radiation. Thus, the exposure through mask portion 2202 will expose the areas of hybrid resist under the edges of blocking shape 2206 and under the grey scale shapes 2208 and 2210 to intermediate amounts of exposure.

Turning to FIG. 23, a wafer portion 2300 with hybrid resist that has been deposited, exposed through the mask 2202 and developed is illustrated. Hybrid resist portions which are unexposed (i.e., the inside region 2304 blocked by mask shape 2206 ) remain insoluble in the developer and form positive tone line patterns. Hybrid resist portions which are exposed with high intensity radiation (i.e., the outside region 2206 not blocked by mask shape 1702) form a negative tone line pattern. Hybrid resist portions which are exposed with intermediate amounts of intensity (i.e., the areas under the edges of blocking mask shape 2206 and the areas under grey-scale mask portions 2208 and 2210) are dissolved during the development step. This forms the space 2312 in the resist.

Thus, both the edges of blocking shapes and the grey scale shapes can be used to define regions of hybrid resist that are exposed to intermediate amounts of radiation, which wash away and forms spaces in the resist during development. These spaces define the first of the three regions which are defined using a single masking step in accordance with the preferred embodiment.

It should also be noted that one advantage in using hybrid resist is that intermediate exposure spaces formed under the edges of blocking mask shapes can be printed with a width of less than 0.2 $\mu$m with current deep ultra violet (DUV) lithography tools that are designed for operation at 0.35 $\mu$m resolution. Thus, by using the edge of a mask shape to define spaces in hybrid resist, smaller dimension features can be created than normal lithography allows.

Returning to the method 2100, the next step 208 is to process the intermediate exposure region. This step can comprise any type of processing in or through the intermediate exposure space in the hybrid resist. For example, an implant can be made through the exposure spaces, a feature material can be deposited into the exposure space, the underlying substrate can be etched through the exposure space, or a combination of any of these or other processes may be performed.

The next step 210 is to blanket expose the wafer. Because portions of the hybrid resist were unexposed during the first exposure in step 204, these regions remain photoactive and now comprise positive tone resist patterns. Thus, by blanket exposing the wafer in step 212, these positive tone resist patterns are polymerized and can be washed away during development. The blanket exposure is preferably an intermediate exposure, either by exposing at a low enough dose or for a short enough time to create an intermediate response to those areas of resist that were unexposed (i.e, the positive tone patterns) in the first exposure step. The positive tone patterns can then be developed away. This defines the second of the three regions that are defined using the preferred embodiment.

In the alternative, the positive tone portions can be removed by a selective etch using a solution of pure n-butyl acetate at room temperature or with a strong base, such as 0.35 Normal ("N") tetramethyl ammonium hydroxide ("TMAH").

Turning to FIGS. 24, 25, and 26, the wafer portion 1802 is illustrated after a blanket exposure and development, where FIG. 25 is a cross section of the wafer portion in FIG. 24 taken along lines 25—25, and FIG. 26 is a cross section of the wafer taken along lines 26—26.

The blanket exposure has caused the positive tone regions (i.e., the hybrid resist portion 1804 (of FIGS. 18, 19 and 20) which were unexposed in step 204 (i.e., blocked by mask shape 1702) to become soluble so that the resist washes away during development. This has formed a positive tone space 2402 in the hybrid resist. This positive tone space 2402 forms the second of the three regions defined by one mask in accordance with the preferred embodiment. Additionally, the areas under the remaining negative tone hybrid resist (i.e., the hybrid resist portions 1806 which were fully exposed in step 204 (i.e., not blocked by mask shape 1702) define the third of the three regions.

Thus, the next step 214 is to process the positive tone space. Again, this step can comprise any type of processing in or through the intermediate exposure space in the hybrid resist. For example, an implant can be made through the exposure spaces, a feature material can be deposited into the exposure space, the underlying substrate can be etched through the exposure space, or a combination of any of these processes performed. Additionally, this processing can also be performed at the same time to the regions defined by the intermediate exposure spaces, or these regions can be blocked off by a suitable deposition before processing of the positive tone hybrid resist defined regions.

With the processing complete, the negative tone resist can be stripped (with a process such as an ozone plasma strip) according to step 216, and any processing of that area performed.

Thus, the preferred embodiment provides a method for defining three regions using a single masking step. It should be noted that several variations to the preferred method are suitable for some applications, and also fall within the scope of the invention. For example, instead of blanket exposing according to step 210 to activate the positive tone regions, a solvent can be applied to selectively dissolve the positive tone portions of the resist. Suitable solvents for this procedure would include N-Butyl Acetate (NBA), and a strong base such as >0.35 Normal Tetra methyl Ammonium IHydroxide (TMAH).

Additionally, various layers on the substrate surface may be used and sacrificed at different times to achieve different results. Alternatively, once areas has been processed in the desired manner, a coating may be applied to protect that area from subsequent processing steps of other areas.

The preferred methods can be applied to define regions on a substrate in a wide variety of applications. One of these applications is in the fabrication of isolation regions, such as shallow trench isolation. Shallow trench isolation is an isolation technique extensively used in modern CMOS devices where isolation between devices is achieved by forming a channel in the silicon deep enough to electrically isolate the diffusions once the channel is filled with a dielectric (such as silicon dioxide and silicone nitride).

Shallow trench isolation is typically formed around and between all the devices on a chip. During the formation of the shallow trench isolation, a chemical mechanical polish (CMP) is used to planarize the completed isolation regions. The disadvantage to this procedures is that large areas of shallow trench isolation regions have a high likelihood of dishing during planerization. The thinner areas caused by the dishing may allow shorting to occur or high parasitic capacitance between over passing conductors and the substrate, thereby resulting in reliability problems in the completed chip.

Figure 41:
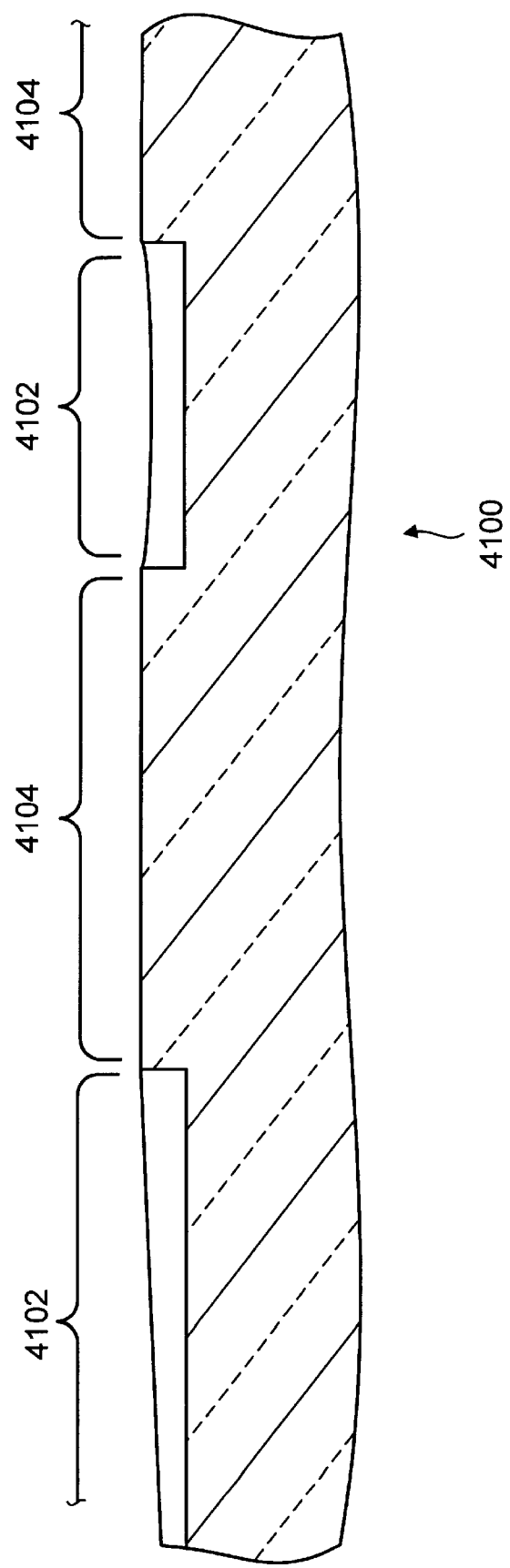
FIG. 41 is a cross section of a wafer portion with prior art shallow trench isolation.

Turning to FIG. 41, a wafer portion 4100 with prior art shallow trench isolation structures is illustrated. Shallow trench isolation has been formed in the isolation regions 4102 leaving the active area regions 4104 for forming various devices. The large regions 4102 of shallow trench isolation result in "dishing" occurring during planerization.

Dishing problems have been typically dealt with by placing extra or dummy shapes generated by a fill program in the isolation region. The fill program places the extra images in the isolation region mask or on a separate mask. The CMP is then stopped by the dummy shapes, minimizing the amount of dishing. Unfortunately, the algorithms used to generate these extra shapes are complex and add more difficulty to the design process. Additionally, generating extra images on separate masks increase the manufacturing cost of the device.

Figure 27:
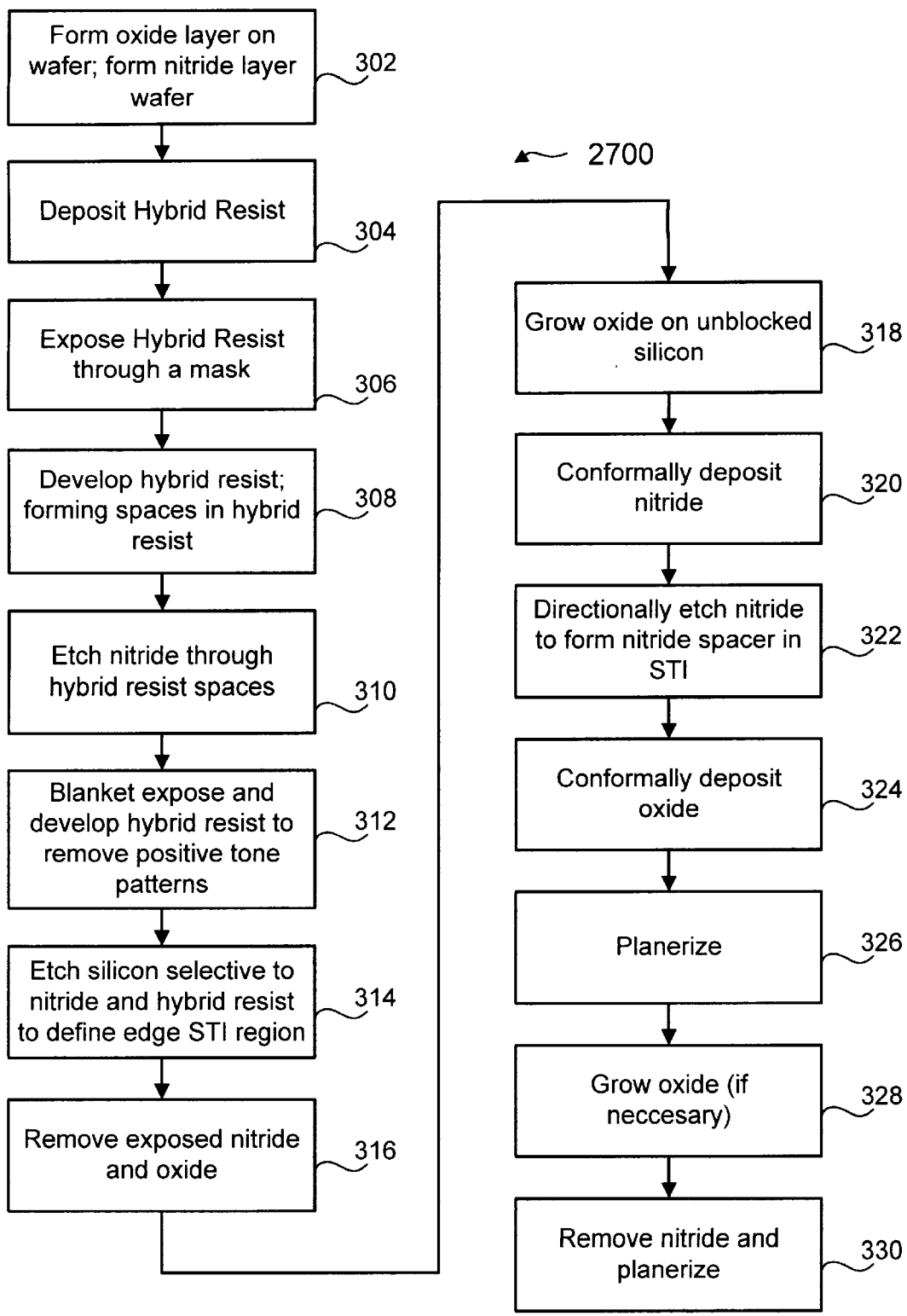
FIG. 27 is a flow diagram for a method for forming shallow trench isolation using the preferred method of defining three regions.

The preferred embodiment method for defining three regions using a single mask can be applied to the problem of forming shallow trench isolation, resulting in an improved STI design. Turning to FIG. 27, a method 2700 for forming shallow trench isolation using hybrid resist is illustrated. The method 2700 facilitates the formation of STI with several advantages over prior art methods. In particular, using hybrid resist to define shallow trench isolation regions has the advantage of being able to create a relatively deep "edge" STI region around the at the edge of the devices and relatively shallow "interior" STI regions between the edge STI regions using a single masking step. Device isolation ideally would be done with deep isolation to remove not only the surface leakage problems, but also isolate against parasitic bipolar leakage mechanisms that can occur under the STI. Furthermore, the method 2700 results in an STI design that has improved filling without the problem of dishing.

Referring now to FIG. 27, assuming a wafer has been properly prepared, the first step 302 of method 2700 is to form an pad oxide layer and a pad nitride layer on the wafer. The pad oxide serves to protect the silicon from the stress induced by the great difference in coefficient of thermal expansion between silicon nitride and siicon. The pad nitride is used as a poish stop for the oxide planerization and also as a barrier to oxidation as the oxidant species cannot diffuse through it, allowing selective oxidation. Of course, other suitable materials and structures can be used.

The next step 304 is to deposit a layer of hybrid resist on the wafer. The wafer is then exposed through a mask in step 306, and developed in step 308. This forms spaces in the hybrid resist where the hybrid resist was exposed to intermediate amounts of exposure. Typically, this occurs at the edge of blocking feature shapes, or underneath grey-scale shapes in the mask. Again, the unique properties of hybrid resist allow these intermediate exposure spaces formed under the edges of blocking mask shapes to be printed with a width of less than 0.2 $\mu$m with current deep ultra violet (DUV) lithography tools that are designed for operation at 0.35 $\mu$m resolution. Thus, by using the edge of a mask shape to define spaces in hybrid resist, smaller dimension features can be created than normal lithography allows.

Figure 28:
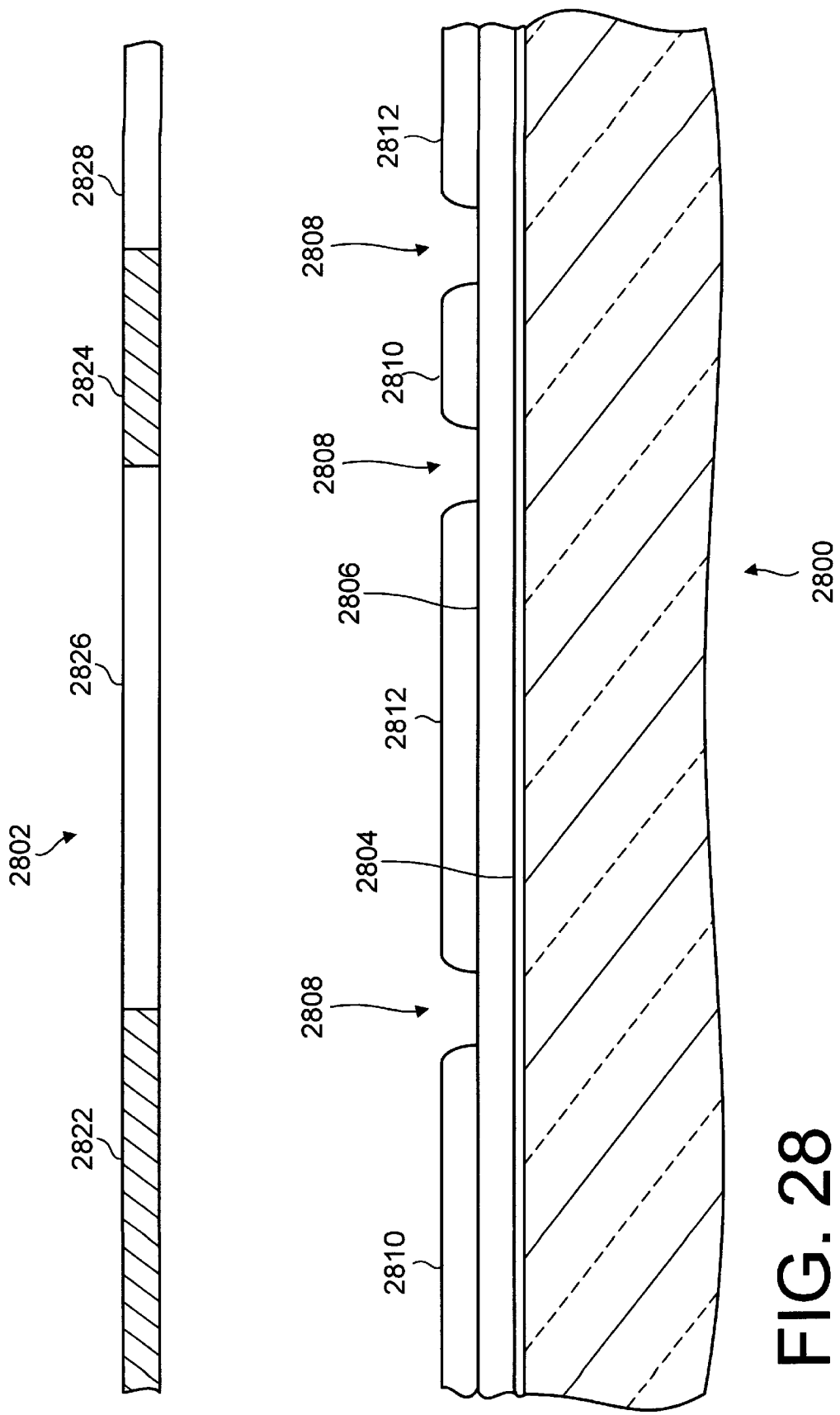
FIGS. 28–40 is a cross section of a wafer portion with shallow trench isolation in various stages of fabrication.

Turning to FIG. 28, a wafer portion 2800 is illustrated. On the wafer portion, an oxide layer 2804 and a nitride layer 2806 have been deposited in accordance with step 302. A hybrid resist layer has been deposited, exposed through a mask portion 2820, and developed in accordance with steps 304–308. The mask portion 2820 includes two blocking shapes 2822 and 2824 which block the hybrid resist during exposure, and two non-blocking shapes 2826 and 2828. Thus, the areas of hybrid resist under the edges of blocking shapes 2822 and 2824 are exposed to intermediate amounts of exposure, and become soluble and wash away during development. This forms spaces 2808 in the hybrid resist.

Additionally, the hybrid resist portions which were unexposed in step 306 (i.e. the regions under blocking shapes 2822 and 2824) remain insoluble in the developer and form positive tone patterns 2810 of resist. Hybrid resist portions which are exposed with high intensity radiation (i.e., the regions under non-blocking shapes 2822 and 2824) form a negative tone line patterns 2812 of resist.

Figure 29:
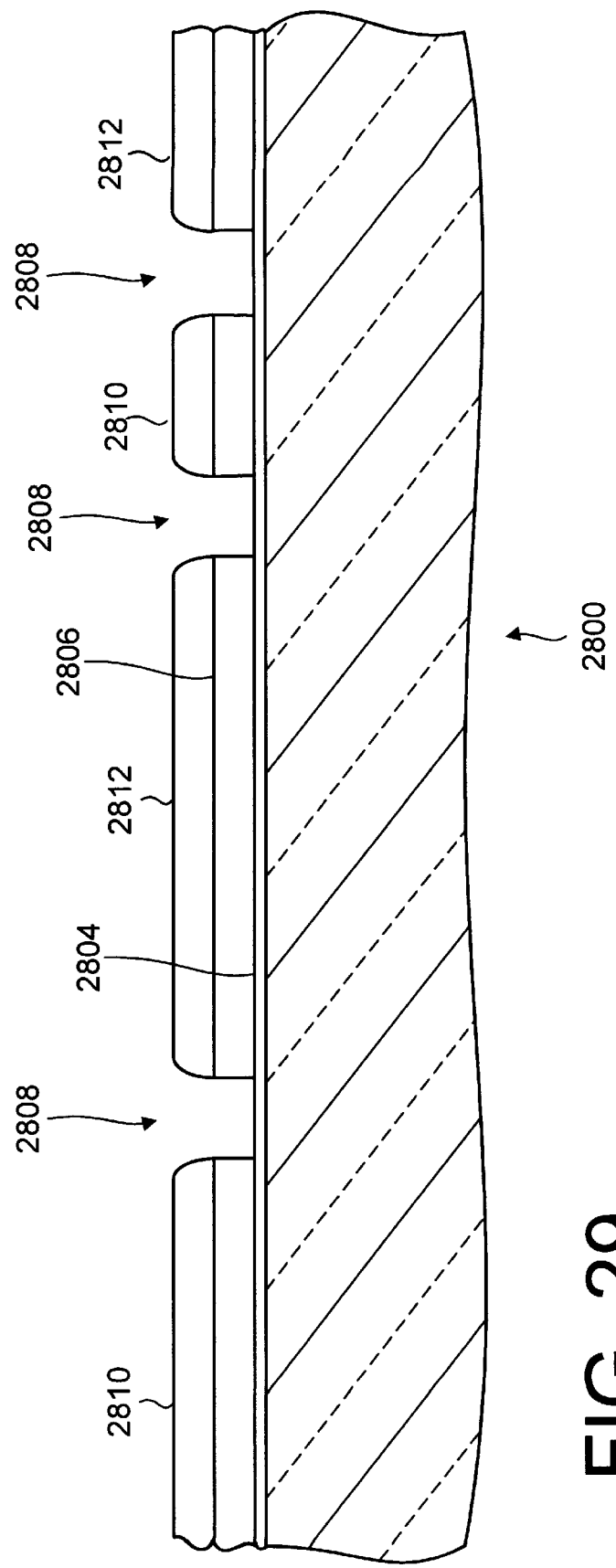

With the hybrid resist so patterned, the next step 310 is to etch the nitride through the spaces in the hybrid resist, with the underlying oxide serving as an etch stop. This etch is preferably done by an reactive ion etch with $NF_3$ and argon or $CHF_3$ and $O_2$, but any suitable etch procedure could be used. Turning to FIG. 29, the wafer portion 2800 is illustrated with the nitride layer 2806 etched away under the spaces 2808, with the oxide layer 2804 serving as a stop.

Figure 30:
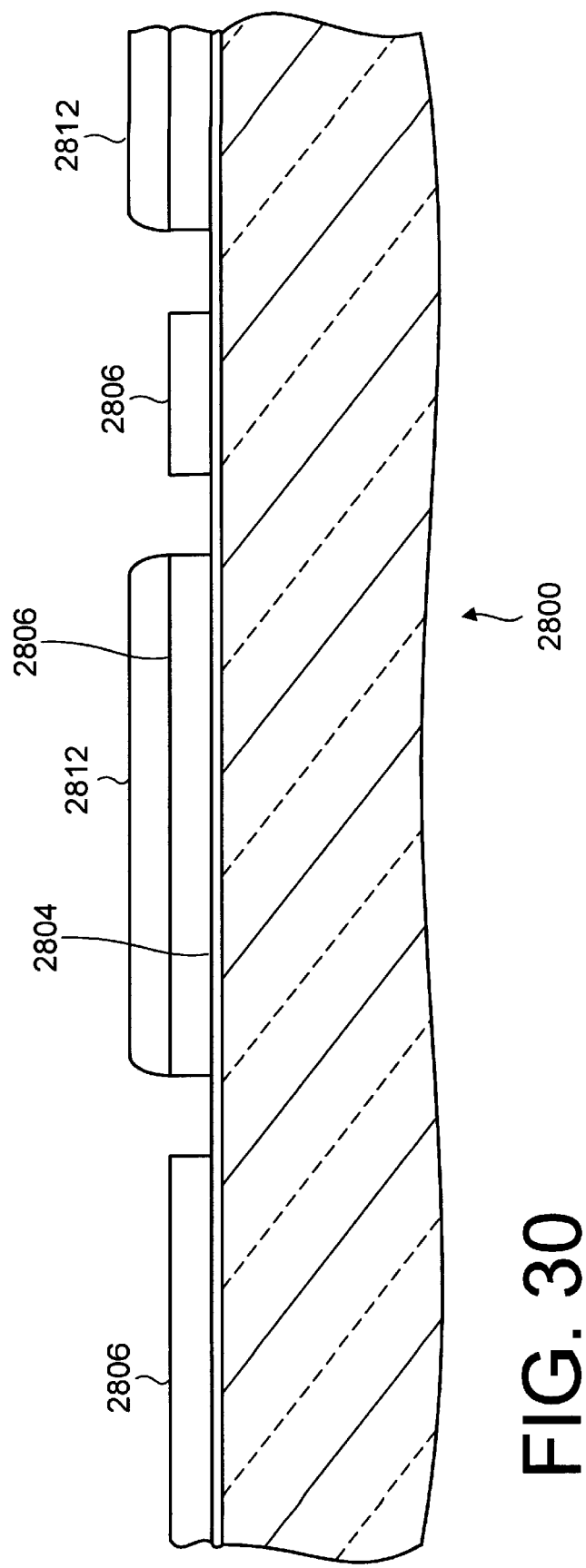

The next step 312 is to blanket expose the hybrid resist and develop. The blanket exposure is preferably an intermediate exposure, either by exposing at a low enough dose or for a short enough time to create an intermediate response to those areas of resist that were unexposed (i.e, the positive tone patterns) in the first exposure step. This step causes the positive tone patterns of the hybrid resist to become soluble and wash away, while leaving the negative tone patterns of hybrid resist. Turning to FIG. 30, the wafer portion 30 is illustrated with the positive tone patterns 2810 developed away. This procedure does not damage the underlying nitride layer 2806 and leaves the negative tone patterns 2812 of hybrid resist.

In the alternative, the positive tone portions can be removed by a selective etch using a solution of pure n-butyl acetate at room temperature or with a strong base, such as 0.35 Normal ("N") tetramethyl ammonium hydroxide ("TMAH") This solvent could be tuned so that it would selectively remove the positive tone areas independent of the negative tone areas, which are cross-linked and are therefore generally insoluble. Again, this would reduce the potential for problems with the positive tone resist areas remaining photoactive through the nitride etch process and does not require additional processing steps.

The next step 314 is to etch the silicon selective to hybrid resist and nitride to define the STI regions. In particular, this process etches the silicon under the spaces 2808 in the hybrid resist to define the edge STI regions that are preferably placed at the device edges in the wafer. This etching is preferably done using halogen based etch chemistries, preferably chlorine or bromine based to maintain selectivity of silicon to nitride. Subsequent to silicon etching, the pad nitride and oxide are stripped off in a fluorocarbon based etch, but could also be accomplished with any other suitable etch procedure.

Figure 31:
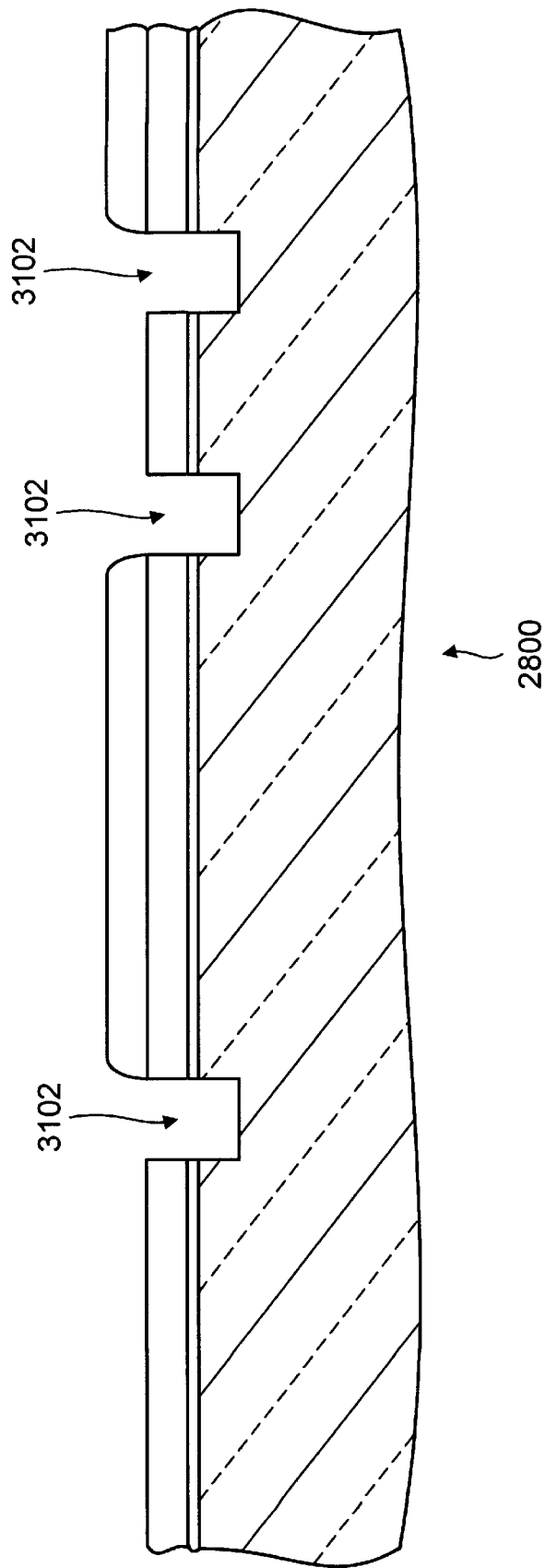

Turning to FIG. 31, the wafer portion 2800 is illustrated with the edge STI regions defined by etching edge troughs 3102 into the silicon in accordance with step 314. Because the spaces 2808 of FIG. 28 were formed using hybrid resist, they can be formed smaller than conventional lithography allows. This facilitates the formation of edge STI troughs 3102 that have a smaller feature size than could be created with conventional methods. Because the edge STI regions comprise a minimal width, a conformal deposition will fill these regions from the sidewall. Thus, the amount of deposition required to fill the edge STI region is independent of the depth of the STI region. In particular, only a dielectric thickness of slightly greater than ½ the edge STI width must be deposited to fill the edge STI regardless of the depth of the STI. Thus, the depth of the edge STI is decoupled from the scaling requirements for deposition thickness.

In contrast, to form a standard STI the entire depth of the STI is filled from the bottom by depositing that amount of dielectric. This makes it difficult to scale traditionally STI technology while maintaining a deep STI, because the thickness of deposited films must scale with the technology shrink factor (as must all film thicknesses) in order to keep all the process steps working. Additionally, more deposited dielectric means more dielectric must be removed by polishing, and thus more possibility for dishing (i.e., the amount of dishing during polish is directly proportional to the amount of material needed to be removed).

Thus, in the preferred embodiment, the required thickness of the dielectric material that needs to be deposited is only approximately ½ the width of the edge STI shape—a feature which is fabricated using the minium feature size capabilities of hybrid resist. This thickness scales and thus offers significant process improvement, including less dishing.

The next step 316 is to remove the exposed nitride and oxide. This is preferably done by etching the nitride and oxide selective to the remaining negative tone hybrid resist pattern.

Figure 32:
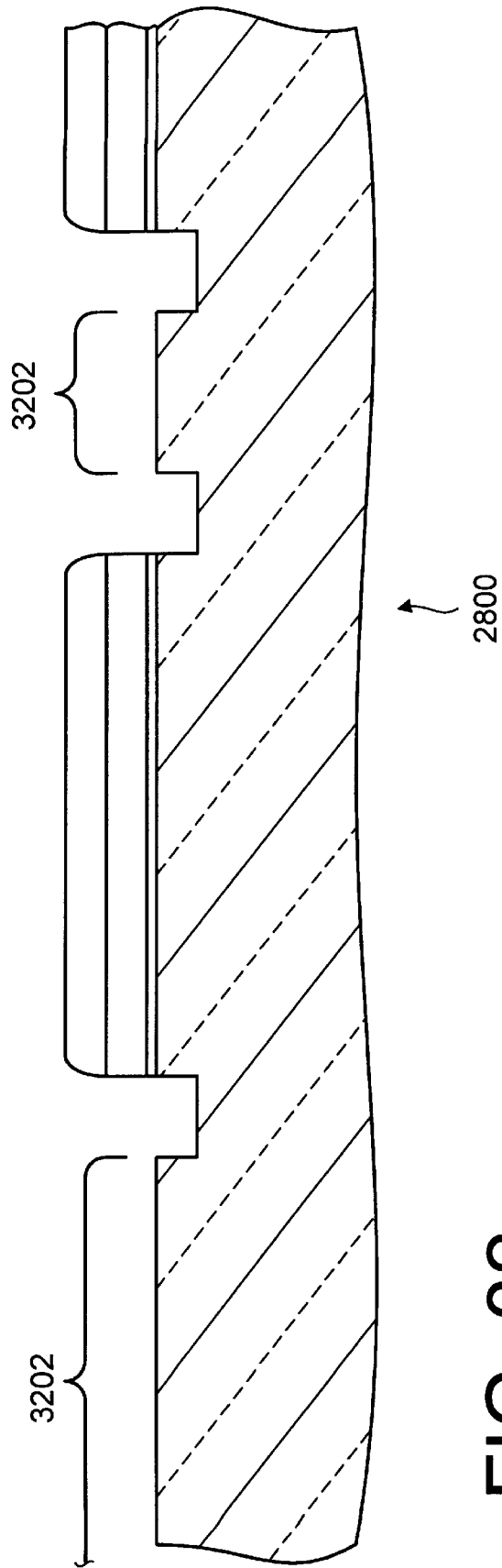

Turning to FIG. 32, the wafer portion 2800 is illustrated with the nitride layer 2806 and the oxide layer 2804 removed where it was not protected by negative tone patterns 2812 of hybrid resist. The regions of silicon which are exposed by this etch define the areas 3202 where the "shallow" portions of STI will be formed.

Figure 33:
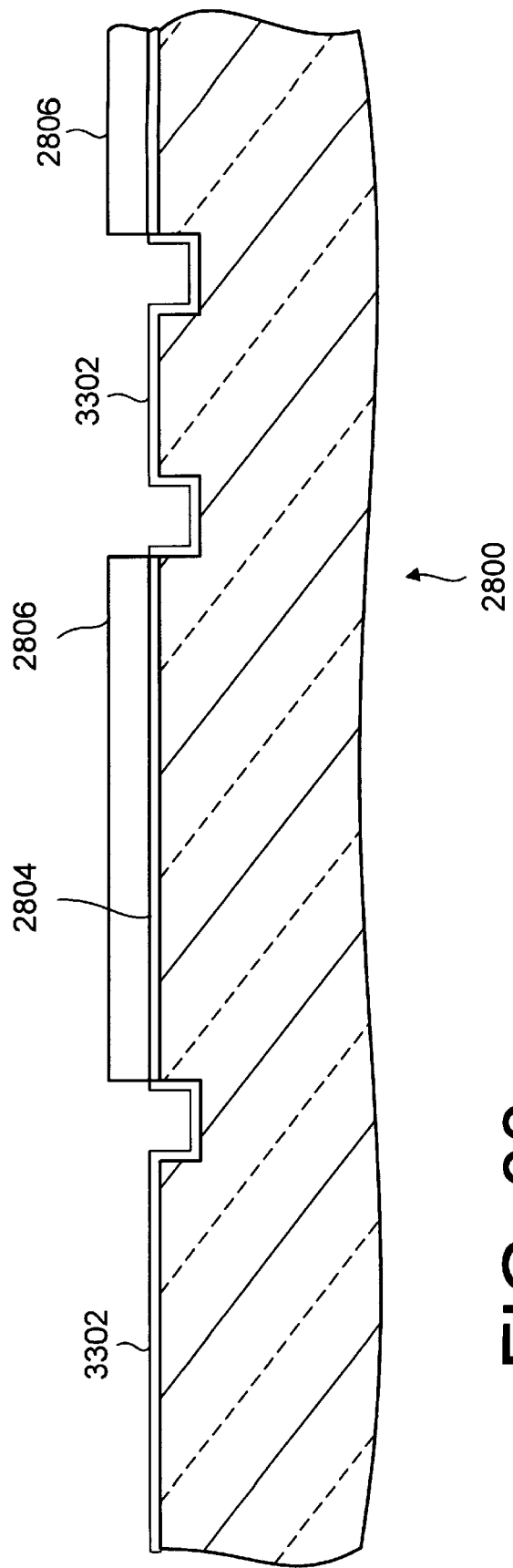

The next step 318 is to grow a thin layer of silicon dioxide on the unblocked silicon. Growing a thin layer of oxide provides a barrier between the silicon and nitride which have grossly different coefficients of thermal expansion which can lead to cracking when heated. Additionally, because growing oxide consumes silicon, the silicon surface drops in areas wear the oxide grows upon it. This drop will partially define the depth of the shallow STI regions. Turning to FIG. 33, wafer portion 2800 is illustrated with a grown silicon oxide layer 3302 over areas of exposed silicon.

Figure 34:
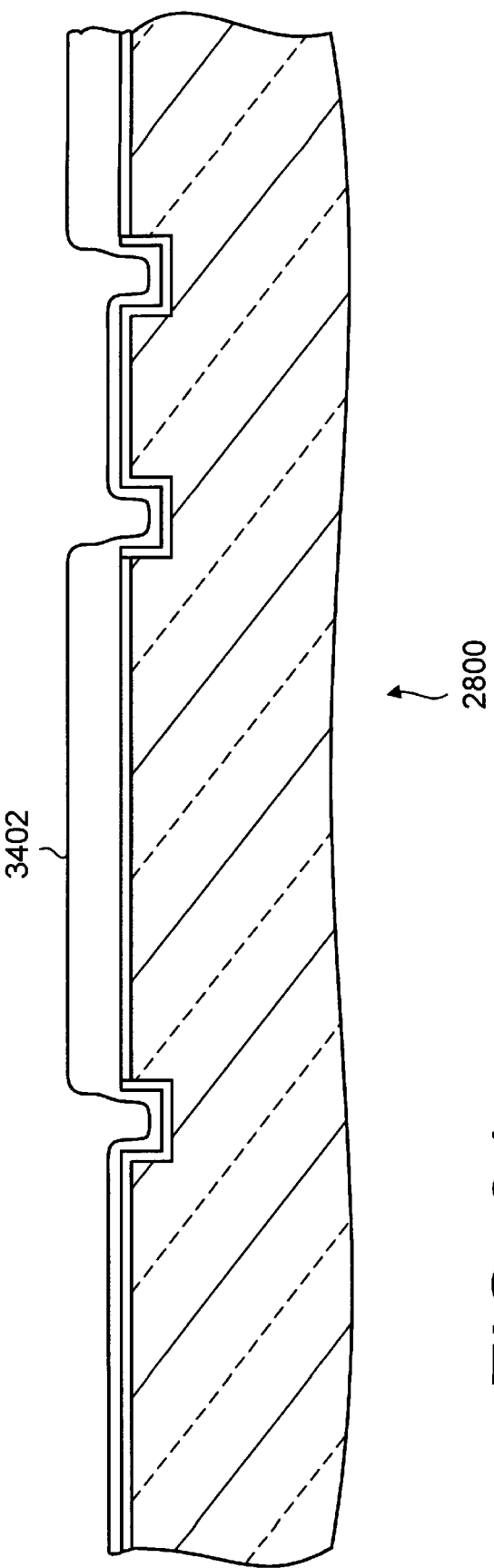

The next step 320 is to conformally deposit nitride over the wafer. The conformal deposition of nitride will be used to form sidewall spacers in the edge STI regions. Turning to FIG. 34, the wafer portion 2800 is illustrated with a layer of nitride 3402 conformally deposited on it. The nitride layer 3402 combines with the previously deposited nitride layer 2806 to form thicker layer of nitride in those areas where the nitride layer 2806 remained after previous processing.

The next step 322 is to directionally etch the nitride. This forms nitride spacers in the edge STI regions, while removing the nitride from the shallow STI regions. The directional etch is preferably done by a reactive ion etch, but can suitably be performed by any directional etch procedure. The nitride spacers prevent oxide from growing under the nitride and forming a "bird's beak" of oxide extending into the device region. Essentially, the nitride spacers extend the oxidation barrier to the bottom the STI trench.

Figure 35:
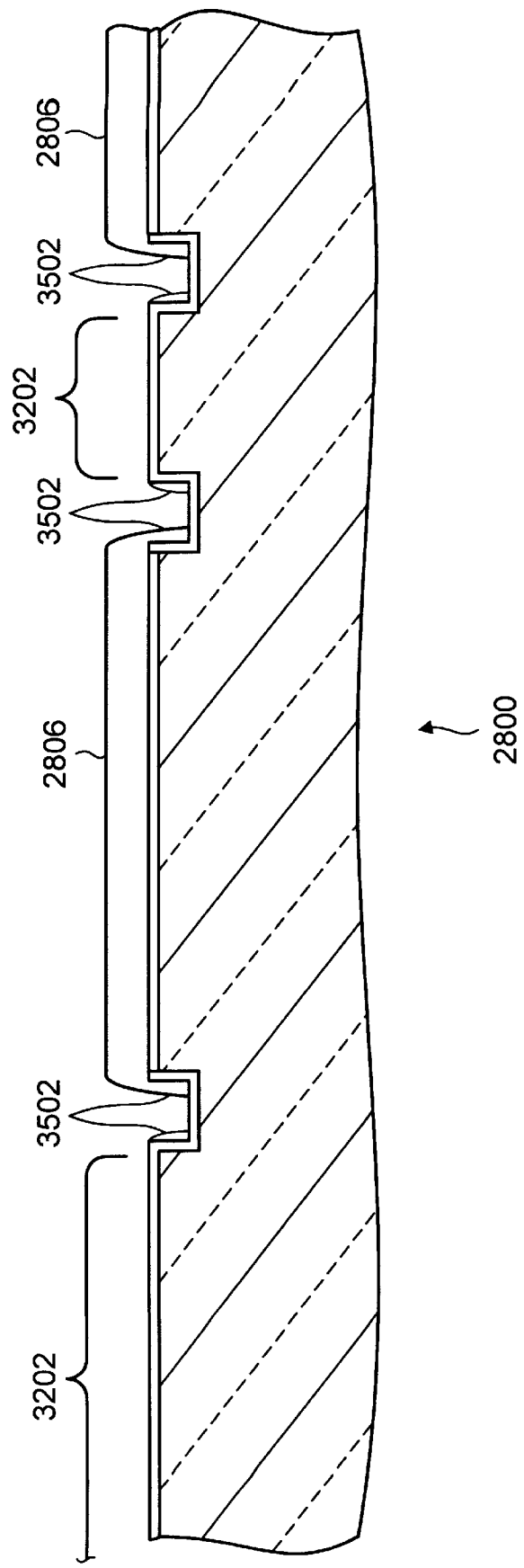

Turning to FIG. 35, the wafer portion 2800 is illustrated with the nitride having been directionally etched to form nitride spacers 3502 in the edge STI regions. All the nitride is removed from the shallow STI regions 3202, while all or a portion of the nitride layer 2806, which was deposited in step 302, remains. The remaining portions of nitride layer 2806 and the nitride spacers 3502 serve as nitride stops in later fabrication steps.

Figure 36:
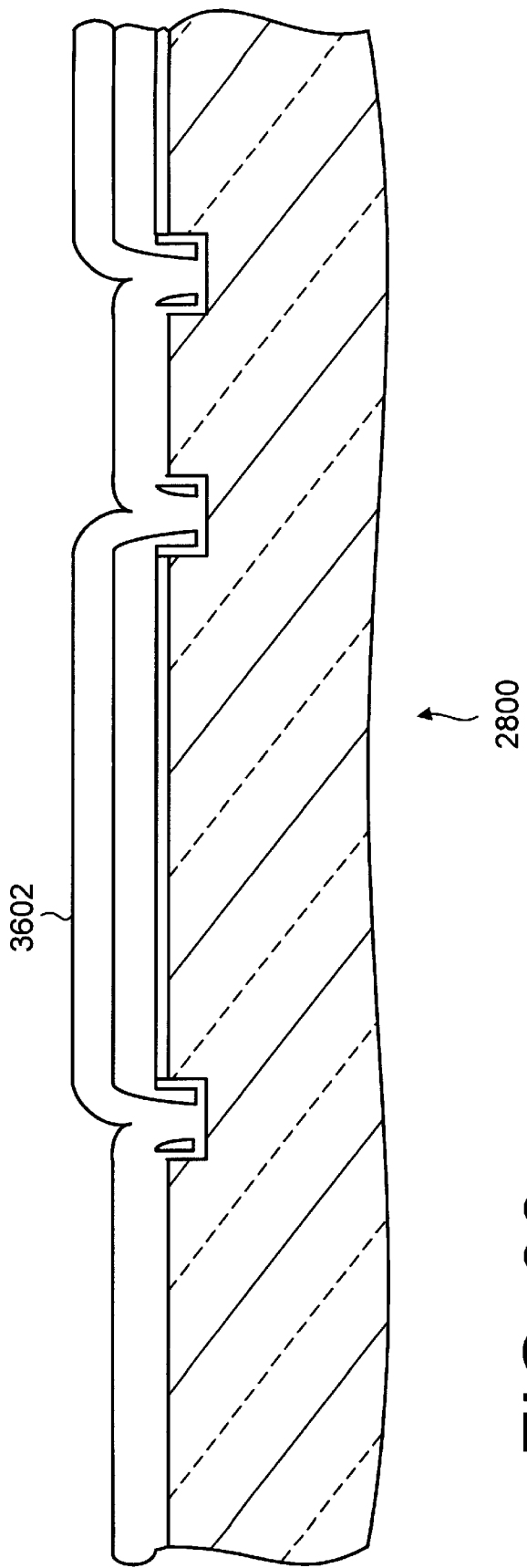

The next step 324 is to conformally deposit a dielectric, preferably silicon dioxide, over the wafer, filling the edge STI regions. Turning to FIG. 36, the wafer portion 2800 is illustrated with an oxide layer 3602 deposited on the surface of the wafer such that the edge STI regions are filled with oxide. Because the edge STI regions are formed using hybrid resist and are thus very narrow, the conformal deposition will quickly fill the edge STI troughs from the sides. This means that less oxide than normal will need to be deposited and less excess oxide will need to be removed. As stated before, this minimal deposition is sufficient regardless of the depth of the edge STI troughs.

Figure 37:
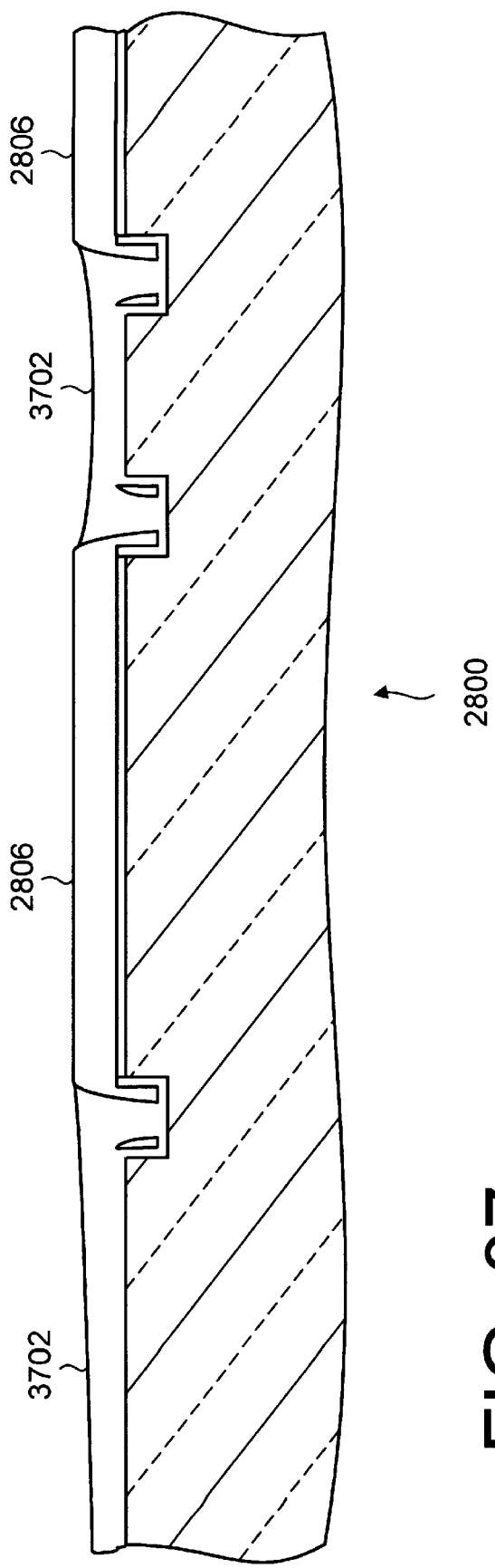
Figure 38:
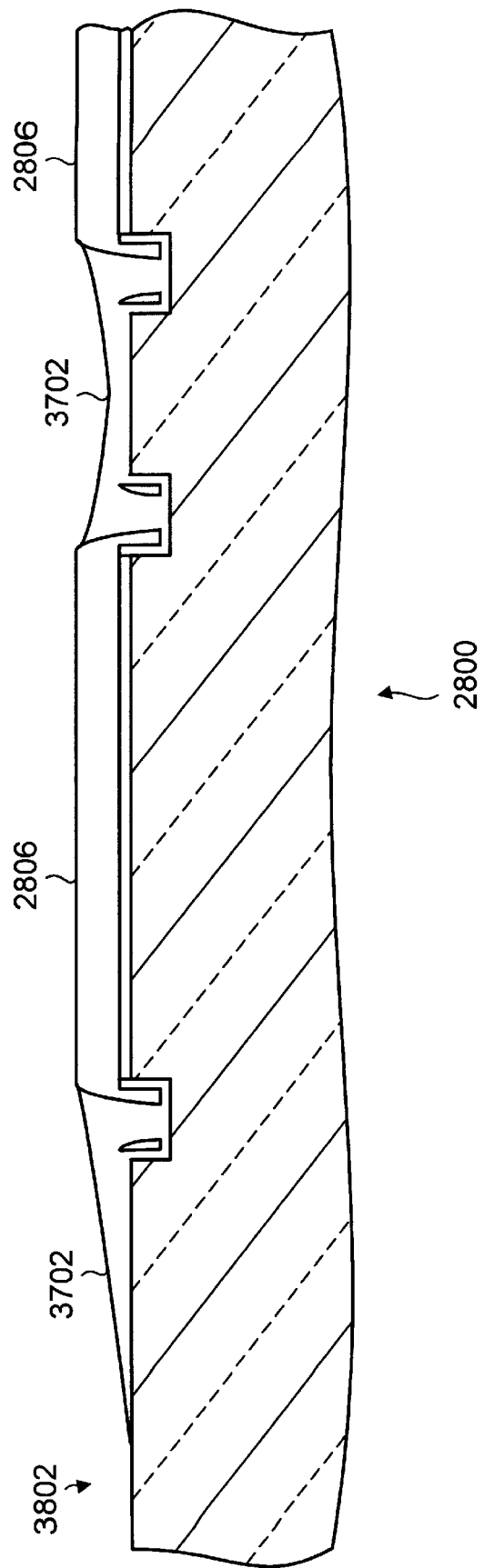

The next step 326 is to planarize the wafer portion to remove the oxide from the nitride, while leaving the oxide in the edge STI regions and the shallow STI regions. The preferred method for so planarizing is to use a chemical-mechanical-polish (CMP). CMP is well known method, but has the disadvantage of being prone to "dishing" where dishing is excessive material removal in the center of large feature areas. Turning to FIG. 37, the wafer portion 2800 is illustrated with the oxide layer partially planarized away. The remaining nitride layer 2806 serves as a stop for the CMP, so an ideal CMP will remove all the oxide from the tops of the nitride layer stop 2806 and create planarized oxide portions 3702. In reality, there will almost always be some dishing in large field areas, as illustrated in FIG. 37. This will usually not be a problem unless the dishing is so severe that the "minimum oxide thickness" (i.e., enough to avoid implant penetration problems and parasitic capacitance problems) does not remain in all regions. This is illustrated in FIG. 38, where the oxide is shown to have been dished away in the center of the shallow STI region, exposing a portion 3802 of the underlying silicon.

Figure 39:
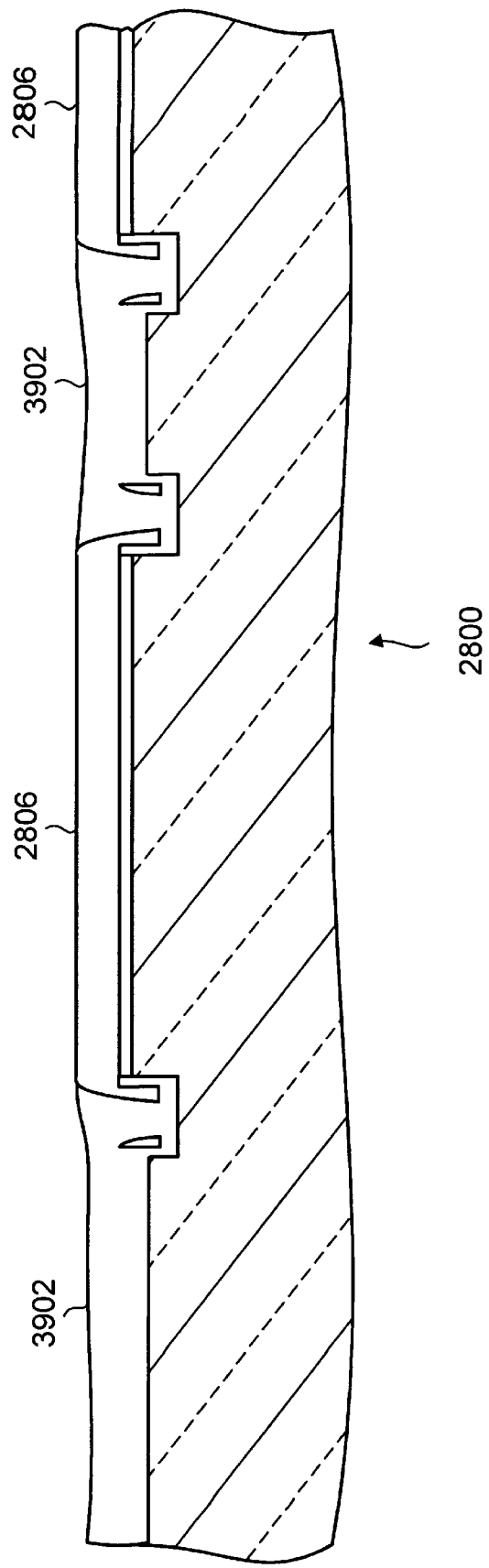

To avoid this problem, the next step 328 is to grow oxide. If in this step, sufficient oxide is grown, then it can assured that the minium thickness of oxide will exist in the STI regions. Oxide grows everywhere the silicon is not blocked by the nitride. Turning to FIG. 39, the wafer portion 2800 is illustrated after additional oxide has been grown to form oxide regions 3902. Again, this process consumes silicon such that the top surface of the silicon drops in the unblocked regions. This further defines the depth of the interior STI regions and the edge STI regions.

The next step 330 is to remove the remaining nitride stops and the excess oxide. This is preferably done by first performing a nitride etch selective to oxide (e.g, hot phosphoric acid) to remove the nitride and then removing the excess oxide (e.g, using dilute hydrofluoric acid), but other suitable methods could be used.

Figure 40:
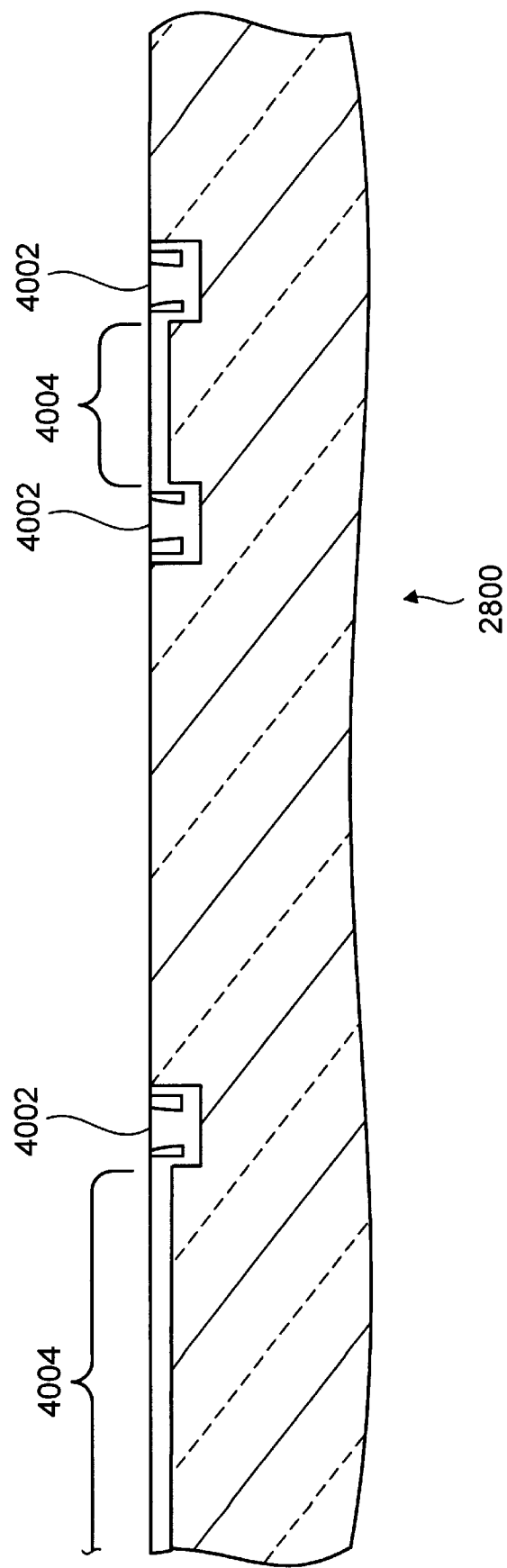

Turning to FIG. 40, the wafer portion 2800 is illustrated with the nitride stops 2806 and the excess portions of oxide 3902 removed. This completes the formation of the STI. In particular, STI's are formed that comprise relatively deep edge STI regions 4002 with shallow interior STI regions 4004 in between. Preferably, the edge STI regions have a sufficient depth to block leakage between source and drain regions while the interior STI regions 4004 only require a minium depth such that problems with implant penetration and to minimize parasitic capacitances between the substrate and overpassing conductive wiring are avoided.

Several variations to method 2700 could be used. For example, a first alternative would be to define the pad nitride layer with a hard mask process to avoid hybrid resist—etch chemistry interaction problems. One potential problem with the preferred embodiment is that the etch of the nitride can make the dual tone positive tone resist insoluble to either method of selectively removing it (i.e. blanket expose/develop or solvent strip). Some standard nitride etches have high flux of energetic molecules that may make the surface of the positive tone regions cross link. Other nitride etches may cause UV exposure (the UV can be generated in the plasma discharge) that could be good or bad for our process.

There is also a potential problem with etch temperature causing cross-linking combination with UV light. These problems can be overcome by choosing appropriate etch chemistries, or a simple using a simple hard mask process. This would preferably involve putting a thick (approximatly 50 nm) oxide layer on top of the layer of nitride that serves as a hard mask. This hard mask layer can be defined with a suitable wet etch (e.g, Buffer HF). The positive tone regions can then be removed as described without any interactions between the hybrid resist and the RIE etch during the nitride etch. A sacrificial layer of oxide could be deposited on the pad nitride layer, defined, and patterned using a wet etch process. This alternative would reduce problems associated with the positive resist remaining photoactive through the nitride etch process, but would add process steps and dimension variability.

While the invention has been particularly shown and described with reference to an exemplary embodiment using hybrid resist and the preferred trim process to form shallow trench isolation regions, those skilled in the art will recognize that the preferred method of defining three regions with a single masking step can be used to form any type of feature, and that various changes in form and details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

We claim:

1. A method for defining three regions on a semiconductor substrate, the method comprising the steps of:

a) depositing a layer of hybrid resist on said semiconductor substrate;

b) exposing said hybrid resist layer through a mask containing a plurality of shapes such that first portions of said hybrid resist arc exposed to a first exposure level, second portions of said hybrid resist are exposed to a second exposure level, and third portions of said hybrid resist arc exposed to a third exposure level, wherein said second exposure level results from diffraction effects at the edges of said plurality of shapes;

c) developing said hybrid resist layer such that said second portions of said hybrid resist are removed, said removal defining a first region on said substrate;

d) removing said first portions of said hybrid resist, said removal defining a second region on said substrate, and said third portions of said hybrid resist defining a third region on said substrate.

2. The method of claim 1 wherein the step of removing said first portions of hybrid resist comprises the steps of:

i) blanket exposing said hybrid resist such that said first portions of said hybrid resist are made soluble; and ii) developing away said first portions of said hybrid resist.

3. The method of claim 2 wherein the step of blanket exposing comprises an exposure at an intermediate exposure level.

4. The method of claim 1 wherein the step of removing said first portions of said hybrid resist comprises dissolving said first portions of said hybrid resist in a solvent that will not dissolve the third portions of said hybrid resist.

5. The method of claim 4 wherein the solvent is selected from the group consisting of:
   n-butyl acetate and tetramethyl ammonium hydroxide.

6. The method of claim 1 wherein the first level of exposure comprises substantially no exposure, wherein said second level of exposure comprises an intermediate exposure, and wherein said third level of exposure comprises a full exposure.

7. The method of claim 6 wherein the first level of exposure leaves said first portion of hybrid resist photoactive, wherein said second level of exposure makes said second portion of hybrid resist soluble in developer and wherein said third level of exposure cross links said third portion of said hybrid resist making it insoluble in developer and no longer photoactive.

8. The method of claim 1 further comprising the step of processing the first region of said semiconductor substrate and processing the second region of said semiconductor substrate.

9. The method of claim 8 wherein the step of processing the first region comprises selectively etching said semiconductor substrate to form edge isolation troughs, and wherein the step of processing said second region comprises forming isolation regions between said edge isolation troughs.

10. The method of claim 8 wherein the semiconductor substrate includes a wafer, a layer of pad oxide on the surface of the wafer and a layer of pad nitride on the pad oxide, and wherein the step processing the first region of said semiconductor substrate comprises:

i) etching nitride through said hybrid resist selective to said pad oxide;

ii) etching said wafer though said etched nitride to form edge isolation troughs in said wafer;

and wherein the step of processing the second region of said semiconductor substrate comprises:

iii) removing portions of said pad nitride and said pad oxide defined by said first portion;

iv) growing silicon dioxide in said second portion.

11. A method for defining three regions on a semiconductor substrate with a single mask, the method comprising the steps of:

a) depositing a layer of hybrid resist on said semiconductor substrate;

b) exposing said hybrid resist layer through a mask containing a plurality of shapes such that first portions of said hybrid resist are exposed to substantially no exposure and remain photoactive, second portions of said hybrid resist are exposed to an intermediate exposure and become soluble in developer and third portions of said hybrid resist are fully exposed and become insoluble in developer, wherein said intermediate exposure level results from diffraction effects at the edges of said plurality of shapes;

c) developing said hybrid resist layer such that said second portions of said hybrid resist are removed, said removal defining a first region on said substrate;

d) processing said first region on said substrate;

e) blanket exposing said substrate to an intermediate exposure such that said first portions of said hybrid resist become soluble in developer;

d) developing said substrate such that said first portions are removed, said removal defining the second region on said substrate;

e) processing said second region on said substrate.

12. A method for forming isolation regions on a semiconductor substrate, the method comprising the steps of:

a) depositing a layer of hybrid resist on said semiconductor substrate;

b) exposing said hybrid resist layer through a mask containing a plurality of shapes such that first portions of said hybrid resist are exposed to a first exposure level; second portions of said hybrid resist are exposed to a second exposure level, and third portions of said hybrid resist are exposed to a third exposure level, wherein said second exposure level results from diffraction effects at the edges of said plurality of shapes;

c) developing said hybrid resist layer such that said second portions of said hybrid resist are removed, said removal defining a first region on said substrate;

d) etching edge isolation troughs in said first region of said substrate;

e) filling said edge isolation troughs with a dielectric;

f) removing said first portions of said hybrid resist, said removal defining a second region on said substrate, and said third portions of said hybrid resist defining a third region on said substrate; and g) forming isolation in said second region on said substrate.

13. The method of claim 12 further comprising the step of forming sidewall spacers in said edge isolation troughs.

14. The method of claim 12 wherein the step of removing said first portions of hybrid resist comprises the steps of:

i) blanket exposing said hybrid resist such that said first portions of said hybrid resist are made soluble; and ii) developing away said first portions of said hybrid resist.

15. The method of claim 14 wherein the step of blanket exposing comprises an exposure at an intermediate exposure level.

16. The method of claim 12 wherein the step of removing said first portions of said hybrid resist comprises dissolving said first portions of said hybrid resist in a solvent that will not dissolve the third portions of said hybrid resist.

17. The method of claim 16 wherein the solvent is selected from the group consisting of:

n-butyl acetate and tetramethyl ammonium hydroxide.

18. The method of claim 12 wherein the first level of exposure comprises substantially no exposure, wherein said second level of exposure comprises an intermediate exposure, and wherein said third level of exposure comprises a full exposure.

19. The method of claim 18 wherein the first level of exposure leaves said first portion of hybrid resist photoactive, wherein said second level of exposure makes said second portion of hybrid resist soluble in developer and wherein said third level of exposure cross links said third portion of said hybrid resist making it insoluble in developer and no longer photoactive.

* * * * *